US012701704B2

(12) United States Patent
Kawamura et al.

(10) Patent No.: US 12,701,704 B2
(45) Date of Patent: Aug. 4, 2026

(54) SEMICONDUCTOR MEMORY DEVICE

(71) Applicant: Kioxia Corporation, Tokyo (JP)

(72) Inventors: Daisuke Kawamura, Kiyosu (JP); Ikuya Saiki, Mie (JP); Tomonori Sakaguchi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 915 days.

(21) Appl. No.: 18/061,133

(22) Filed: Dec. 2, 2022

(65) Prior Publication Data

US 2023/0422498 A1 Dec. 28, 2023

(30) Foreign Application Priority Data

Jun. 22, 2022 (JP) ................................. 2022-100607

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |
| *H10W 20/41* | (2026.01) |

(52) U.S. Cl.
CPC ............. *H10B 43/27* (2023.02); *H10B 41/10* (2023.02); *H10B 41/27* (2023.02); *H10B 43/10* (2023.02); *H10W 20/435* (2026.01)

(58) Field of Classification Search
CPC ........ H10B 43/27; H10B 43/10; H10B 43/50; H10B 41/10; H10B 41/27; H10W 20/435
See application file for complete search history.

(56) References Cited

U.S. PATENT DOCUMENTS

| | | | |
|---|---|---|---|
| 10,950,628 B2 | 3/2021 | Baek | |
| 11,031,413 B2 | 6/2021 | Xiao et al. | |
| 11,049,866 B2 | 6/2021 | Guo et al. | |
| 11,189,637 B2 | 11/2021 | Tobioka | |
| 11,973,024 B2 * | 4/2024 | Kato ........................ | H10P 50/73 |
| 12,190,952 B2 * | 1/2025 | Tanaka ............... | G11C 16/0483 |

(Continued)

FOREIGN PATENT DOCUMENTS

| | | |
|---|---|---|
| JP | 2020-60666 A | 4/2020 |
| JP | 2022-37583 A | 3/2022 |

*Primary Examiner* — William B Partridge
*Assistant Examiner* — Linda J. Fleck
(74) *Attorney, Agent, or Firm* — Oblon, McClelland, Maier & Neustadt, L.L.P.

(57) ABSTRACT

According to one embodiment, a semiconductor memory device includes a plurality of first contacts arranged in a staircase region on one side in a second direction of a plate-like portion and along the plate-like portion, and individually connected to at least lower conductive layers among the plurality of terraced conductive layers in a first staircase portion; and a plurality of second contacts arranged in the staircase region on another side in the second direction of the plate-like portion and along the plate-like portion, and individually connected to the at least lower conductive layers in the first staircase portion, in which the plurality of first contacts is individually arranged at different positions in the second direction relative to the plate-like portion, depending on the positions in a first direction, and the plurality of second contacts is individually arranged at positions inverted in the second direction from the respective positions of the plurality of first contacts, with respect to the plate-like portion.

20 Claims, 11 Drawing Sheets

(56)          References Cited

U.S. PATENT DOCUMENTS

| | | |
|---|---|---|
| 2016/0240547 A1 | 8/2016 | Tagami et al. |
| 2020/0117104 A1 | 4/2020 | Hino et al. |
| 2021/0391351 A1 | 12/2021 | Takimoto et al. |
| 2022/0020681 A1 | 1/2022 | Nojima et al. |
| 2022/0068950 A1 | 3/2022 | Kawamura et al. |
| 2023/0422499 A1* | 12/2023 | Suzuki .................. H10B 43/10 |

* cited by examiner

X DIRECTION

S101
CUA, LOWER WIRING

S111
STACK LOWER ONO

S112
LOWER STAIRCASE

S113
LMH/LHR

S121
STACK UPPER ONO

S122
UPPER STAIRCASE

S123
UMH/UHR

S131
FORM MANOS

S132
PROCESS ST AND C4

S133
FORM TP STRUCTURE

S134
REMOVE SACRIFICIAL LAYER FOR WL

S135
REPLACE WITH WL

S136
FILL LI AND C4 WITH CONDUCTIVE LAYER

S137
SHE

S141
CH

S142
CC

S143
FILL CH/CC WITH W

S144
VY/V0

S145
FORM BL

S146
FORM UPPER WIRING

SEMICONDUCTOR MEMORY DEVICE

CROSS-REFERENCE TO RELATED APPLICATIONS

This application is based upon and claims the benefit of priority from Japanese Patent Application No. 2022-100607, filed on Jun. 22, 2022; the entire contents of which are incorporated herein by reference.

FIELD

Embodiments described herein relate generally to a semiconductor memory device.

BACKGROUND

Semiconductor memory device such as three-dimensional nonvolatile memory typically has a structure in which a plurality of conductive layers is stacked. This sort of stacked structure, when stressed during the manufacturing process, may occasionally cause deviation in positional relation among components in such stacked structure, up to an unacceptable level in terms of operation of the product, or quality control.

DETAILED DESCRIPTION

In general, according to one embodiment, the semiconductor memory device includes a stacked body in which a plurality of conductive layers and a plurality of insulating layers are alternately stacked one by one, the stacked body including a memory region and a staircase region arranged in a first direction that intersects a stacking direction of the plurality of conductive layers; a plate-like portion that extends in the stacked body in the stacking direction and in the first direction, and divides the stacked body in a second direction that intersects the stacking direction and the first direction; a plurality of first pillars dispersedly arranged in the memory region and extending in the stacked body in the stacking direction; a first staircase portion that is arranged in the staircase region at a position that overlaps the plate-like portion in the stacking direction, in which the plurality of conductive layers is terraced in the first direction; a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion; a plurality of first contacts arranged in the staircase region on one side in the second direction of the plate-like portion and along the plate-like portion, and individually connected to at least lower conductive layers among the plurality of terraced conductive layers in the first staircase portion; and a plurality of second contacts arranged in the staircase region on another side in the second direction of the plate-like portion and along the plate-like portion, and individually connected to the at least lower conductive layers in the first staircase portion, in which the plurality of first contacts is individually arranged at different positions in the second direction relative to the plate-like portion, depending on positions in the first direction, and the plurality of second contacts is individually arranged at positions inverted in the second direction from the respective positions of the plurality of first contacts, with respect to the plate-like portion.

Exemplary embodiments of this invention will be explained below in detail with reference to the accompanying drawings. The present invention is not limited by the following embodiments. Also note that constituents in the following embodiments include those that would be easily conceived by a person skilled in the art, or any constituents that are substantially the same.

First Embodiment

Hereinafter, a first embodiment will be detailed referring to the attached drawings.

(Exemplary Structure of Semiconductor Memory Device)

Figure 1A:
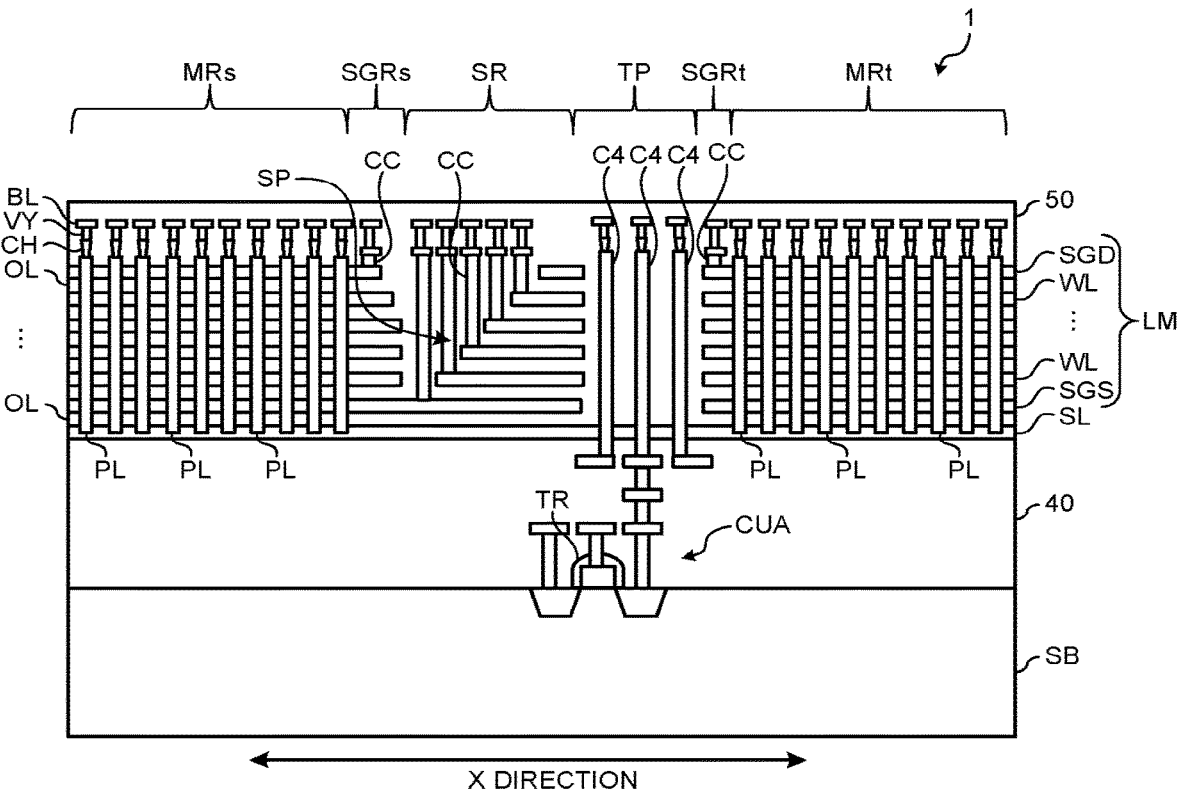
FIGS. 1A and 1B are drawings illustrating an exemplary schematic structure of a semiconductor memory device according to a first embodiment.
Figure 1B:
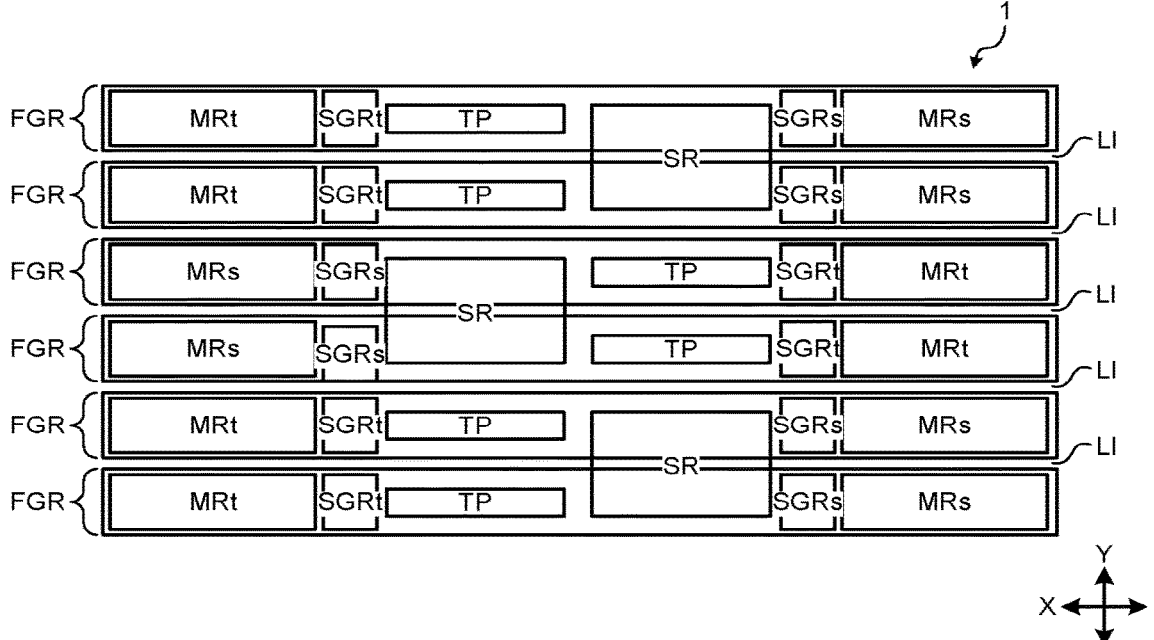

FIGS. 1A and 1B are drawings illustrating an exemplary schematic structure of a semiconductor memory device 1 according to the first embodiment. FIG. 1A is a cross-sectional view of the semiconductor memory device 1 in the X direction, and FIG. 1B is a schematic plan view illustrating a layout of the semiconductor memory device 1. FIG. 1A is presented without hatching for better visibility. FIG. 1A is also presented without some of upper wirings.

In the present specification, both the X direction and the Y direction are laid along a plane of word line WL described later, where the X direction and the Y direction are orthogonal to each other. A direction the word line WL is electrically drawn may occasionally be referred to as a "first direction", which is laid along the X direction. Meanwhile, a direction that crosses the first direction may occasionally be referred to as a "second direction", which is laid along the Y direction. Note that the first direction and the second direction are not always necessarily orthogonal to each other, due to possible manufacturing variability of the semiconductor memory device 1.

As illustrated in FIGS. 1A and 1B, the semiconductor memory device 1 has a peripheral circuit CUA, and a stacked body LM, arranged in this order on a substrate SB.

The substrate SB is typically a semiconductor substrate such as a silicon substrate. The substrate SB has, arranged thereon, the peripheral circuit CUA that contains a transistor TR, wirings and so forth. The peripheral circuit CUA contributes to operation of a memory cell described later.

The peripheral circuit CUA is covered with an insulating film 40 such as a silicon oxide film. On the insulating film 40, a source line SL is arranged. Above the source line SL, a stacked body LM is arranged. The stacked body LM has a structure in which a plurality of word lines WL and a plurality of insulating layers OL are alternately stacked. A select gate line SGD is arranged above the topmost word line WL while placing the insulating layer OL in between, meanwhile a select gate line SGS is arranged below the lowermost word line WL while placing the insulating layer OL in between.

The word line WL and the select gate lines SGD and SGS are typically tungsten layers or molybdenum layers, meanwhile the insulating layer OL is typically a silicon oxide layer.

The stacked body LM is covered with an insulating film 50. The insulating film 50 is typically a silicon oxide film. The insulating film 50 also extends to the periphery of the stacked body LM.

In the stacked body LM, there is arranged a plurality of plate-like contacts LI each penetrates the stacked body LM in the stacking direction, and extends in a direction along the X direction. The stacked body LM is thus divided in the Y direction by the plurality of plate-like contacts LI. The plurality of plate-like contacts LI is typically connected at the lower end to the source line SL, and function as source line contacts.

Between every adjacent plate-like contacts LI, there are a plurality of memory regions MR, select gate contact regions SGR, a staircase region SR, and a through-contact region TP, arranged in line in the X direction. Such structure, having the memory regions MR, the select gate contact regions SGR, the staircase region SR, and a through-contact region TP arranged between the plate-like contacts LI neighboring in the Y direction, is typically referred to as a finger FGR.

In two fingers FGR adjoining in the Y direction, there are typically the memory region MRs, the select gate contact region SGRs, the staircase region SR, the through-contact region TP, the select gate contact region SGRt, and the memory region MRt, which are arranged in this order from one side to the other side in the X direction. In another two fingers FGR adjoining these fingers FGR in the Y direction, there are typically the memory region MRt, the select gate contact region SGRt, the through-contact region TP, the staircase region SR, the select gate contact region SGRs, and the memory region MRs, which are arranged in this order from one side to the other side in the X direction.

The semiconductor memory device 1 thus follows a pattern in which four fingers FGR arranged in the Y direction forms a minimum unit to be repeated periodically in the Y direction.

Note that, for the convenience of distinguishing the plurality of memory regions MR and the plurality of select gate contact regions SGR arranged in the X direction, those neighboring the staircase region SR without placing the through-contact region TP in between are denoted as the memory region MRs and the select gate contact region SGRs. Meanwhile, those arranged in line with the staircase region SR in the X direction, while placing the through-contact region TP in between are denoted as the memory region MRt and the select gate contact region SGRt. Simple notations such as memory region MR and select gate contact region SGR will suffice, if the discrimination is not necessary.

The memory region MR has arranged therein a plurality of pillars PL, each penetrating the stacked body LM in the stacking direction. The pillars PL are connected, through plugs CH and VY, to bit lines BL arranged above the stacked body LM. Each pillar PL has a multi-layered structure called MANOS (metal-alumina-nitride-oxide-silicon) structure. A plurality of memory cells is formed at the intersections of the pillars PL with the word lines WL. Hence, the semiconductor memory device 1 is typically structured as a three-dimensional nonvolatile memory in which the memory cells are arranged three-dimensionally in the memory region MR.

The staircase region SR has a plurality of staircase portions SP in which the plurality of word lines WL is terraced downwards in the stacking direction to give a shape referred to as valley-like shape at least in the Y direction. Each step of the staircase portion SP is constituted typically by the word line WL in each layer. The word line WL in each layer establishes electrical conduction on both sides in the X direction while placing the staircase region SR in between, through one side in the Y direction of the staircase region SR. At a terrace portion in each step of the staircase portion SP, there is arranged a contact CC that is connected to the word line WL in each layer. These contacts CC are electrically connected, through the upper wirings and so forth of the stacked body LM, to a peripheral circuit CUA.

This enables leading-out of the individual word lines WL that are stacked in multiple layers. Through these contacts CC, typically write voltage and read voltage are applied to the memory cells in the memory regions MR that are arranged on both sides in the X direction, by way of the word lines WL laid at the same level of height with the memory cells.

Note in this specification that the direction, the terrace faces of the terraced word lines WL are facing, is defined as the upward direction.

In the select gate contact region SGR, one or a plurality of select gate lines SGD is terraced in the X direction. The contact CC is connected to each select gate line SGD. The contacts CC connected to the select gate lines SGD may also be arranged at both ends in the X direction of the stacked body LM.

In the through contact region TP, there are through-contacts C4 arranged so as to extend through the stacked body LM. The through-contacts C4 connect the peripheral circuit CUA arranged on the lower substrate SB, and the contacts CC of the staircase portion SP. Various types of voltage applied through the contacts CC to the memory cells are controlled by the peripheral circuit CUA, typically by way of the through-contacts C4.

The thus configured semiconductor memory device 1 has stress that would occur among various components contained in the semiconductor memory device 1.

Figures 2A, 2B, 2C, 2D, 2E:
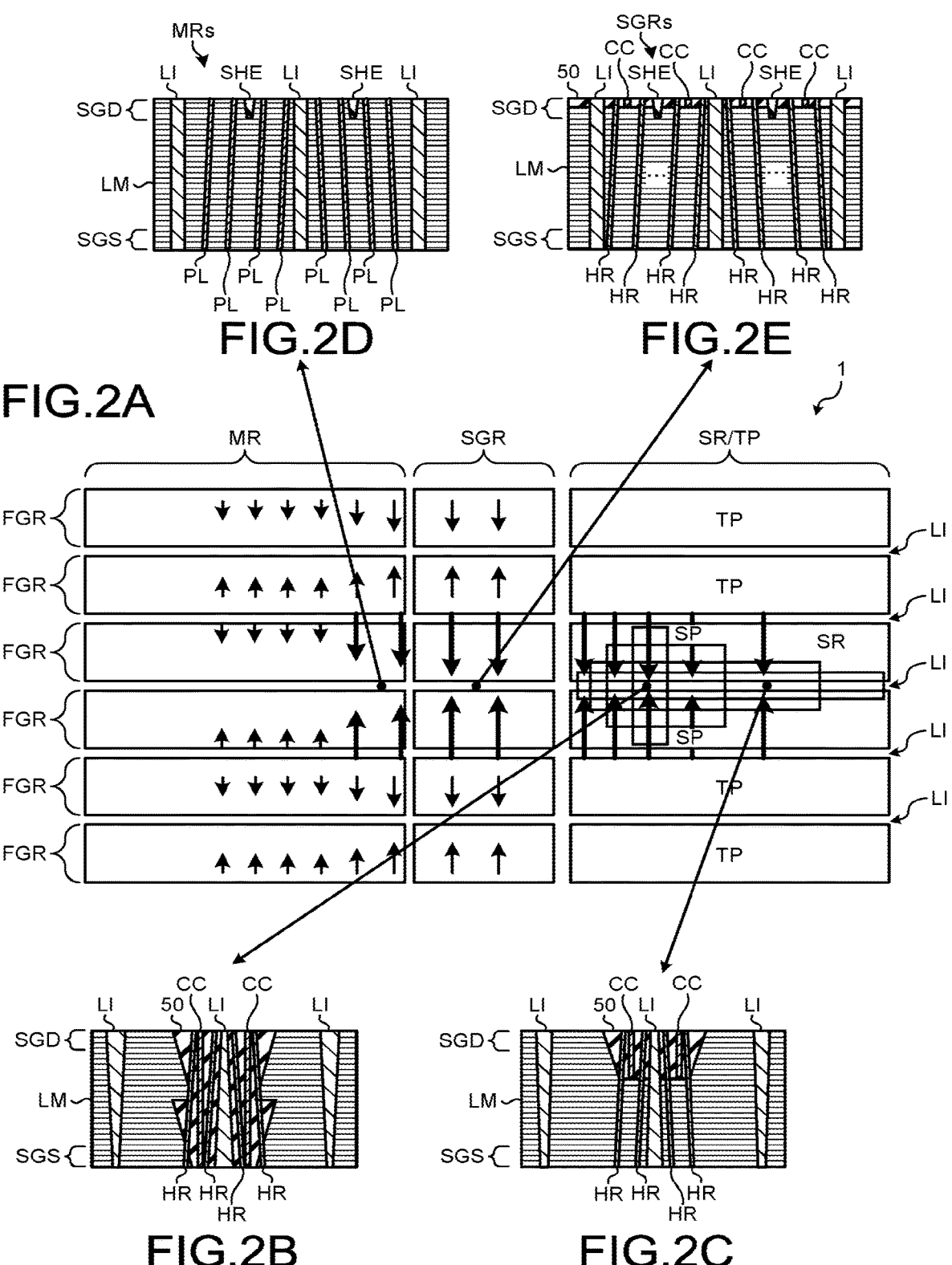
FIGS. 2A to 2E are drawings illustrating stress possibly produced in the semiconductor memory device according to the first embodiment.

FIGS. 2A to 2E are drawings illustrating stress possibly produced in the semiconductor memory device 1 according to the first embodiment. FIG. 2A is a plan view schematically illustrating stress possibly produced in the semiconductor memory device 1. FIGS. 2B to 2E are cross-sectional views in the Y direction, at different positions in the X direction of the semiconductor memory device 1.

As illustrated in FIGS. 2A to 2E, the semiconductor memory device 1 has the memory region MR, and the staircase region SR or the through-contact region TP arranged in line in the X direction, per the finger FGR. Between the memory region MR, and the staircase region SR or the through-contact region TP, there is arranged the select gate contact region SGR.

In the select gate contact region SGR, one or a plurality of select gate lines SGD is terraced in the X direction, and the contact CC connects to each of the select gate lines SGD. The staircase region SR has a staircase portion SP in which the plurality of word lines WL, and select gate lines SGD and SGS are terraced, and the contact CC connects to each of the word lines WL and the select gate lines SGS.

In the staircase region SR and the select gate contact region SGR, also arranged are columnar portions HR. Each columnar portion HR extends through the stacked body LM in the stacking direction of the stacked body LM, to support the stacked body LM during a manufacturing process of the semiconductor memory device 1 described later.

The columnar portion HR arranged in the staircase region SR is solely composed of an insulating layer such as a silicon oxide layer. The columnar portion HR arranged in the select gate contact region SGR has a MANOS structure, similarly for example to the pillar PL. The plurality of columnar portions HR is also arranged in the through-contact region TP, although not illustrated. The columnar portion HR arranged in the through-contact region TP typically has the MANOS structure, similarly to the columnar portion HR in the select gate contact region SGR.

The staircase region SR has a plane bottomed valley-like shape surrounded, steep on both sides in the Y direction and one side in the X direction and moderate on the other side in the X direction, by the staircase part in which the plurality of word lines WL and the select gate lines SGD and SGS are terraced. That is, the staircase part on both sides in the X direction face each other in the X direction, and descend towards the mutual sides. Meanwhile, the staircase part on both sides in the Y direction face each other in the Y direction, and descend towards the mutual sides. The valley-like shape region is filled with the insulating film 50, at least up to a level of height of the stacked body LM.

Of the staircase part on both sides in the X direction, the staircase part arranged on the side away from the memory region MR and from the select gate contact region SGR constitutes the staircase portion SP. In the staircase region SR, a plate-like contact LI is arranged so as to divide the staircase region SR in the Y direction, at a position that overlaps the stacking direction of the stacked body LM. Also the staircase portion SP is divided by the plate-like contact LI in the Y direction. Hence, a single staircase region SR contains two staircase portions SP arranged on both sides in the Y direction across the plate-like contact LI.

Of the staircase part on both sides in the X direction, the staircase part arranged on the side closer to memory region MR and to the select gate contact region SGR constitutes a dummy staircase portion in which the contact CC is not arranged. The dummy staircase portion is typically constituted by the terraced word lines WL, and has a terrace face narrower than in the staircase portion SP, and a staircase length shorter than in the staircase portion SP.

Now, the staircase length of each staircase part is a length from the uppermost step to the lowermost step of the staircase part. The staircase length may include a bottom portion located below the lowermost step of these staircase parts.

The staircase parts on both sides in the Y direction are dummy staircase portions in which the contact CC is not arranged, similarly to the dummy staircase portion facing the staircase portion SP in the X direction. Also the dummy staircase portions on both sides in the Y direction are typically constituted by the terraced word lines WL, and has a terrace face narrower than in the staircase portion SP, and a staircase length shorter than in the staircase portion SP. The staircase lengths of these dummy staircase portions are different depending on the position in the X direction.

More specifically, the staircase length of the dummy staircase portions on both sides in the Y direction is shorter, at a position adjacent to the portions where the upper word lines WL and so forth of the staircase part on both sides in the X direction are terraced, meanwhile the staircase length of the dummy staircase portions on both sides in the Y direction is longer, at a position adjacent to the portions where the lower word lines WL and so forth of the staircase part on both sides in the X direction are terraced. For example, the staircase length of the dummy staircase portions on both sides in the Y direction becomes longest, at a position where the select gate line SGS in the lowermost layer of the staircase part on both sides in the X direction is terraced.

Hence, at a portion where the select gate line SGS in the lowermost layer is terraced, the width in the Y direction of the staircase parts on both sides in the Y direction becomes maximum.

The dummy staircase portions opposed in the Y direction are mutually divided by the plate-like contact LI that isolates the staircase region SR in the Y direction. These dummy staircase portions have a mutually inverted structure in the Y direction with respect to the plate-like contact LI. That is, the dummy staircase portions on both sides in the Y direction of the plate-like contact LI have a substantially line-symmetric structure with respect to the plate-like contact LI.

Note that, in this specification, notation with use of substantially line symmetric, substantially linear, substantially equal, substantially aligned, substantially constant or the like includes not only cases of being completely line symmetric, linear, equal, matched, constant or the like, but also cases of being line symmetric, linear, equal, aligned, constant or the like, within an acceptable range of manufacturing variability of the semiconductor memory device 1.

With a plurality of staircase parts being arranged as described above, the region surrounded by these staircase parts has a shape referred to as valley-like shape, having a moderate staircase portion SP in one direction, and steep staircase parts in the other directions.

Now, the stacked body LM typically has a two-tier structure in which sacrificial layers that correspond to the plurality of word lines WL, and a plurality of insulating layers OL and so forth are stacked in two division. In the stacked body LM having the two-tier structure, also the staircase portion SP and the dummy staircase portion are formed in two division. In this case, in view of minimizing the staircase length of the dummy staircase portions that do not contribute to functions of the semiconductor memory device 1, the dummy staircase portions in the upper and lower tiers are formed to overlap in the stacking direction of the stacked body LM.

FIG. 2B is a cross-sectional view in the Y direction, illustrating a portion where the word line WL or the select gate line SGS in the lowermost layer of the staircase portion SP is terraced. A part of the staircase portion SP illustrated in FIG. 2B corresponds to the deepest part of the valley-like shape of the staircase region SR, where also the thickness of the insulating film 50 filled in the valley-like shape becomes maximum. The deepest part of the valley-like shape is also a portion where the width in the Y direction of the dummy staircase portions on both sides in the Y direction becomes maximum, and where also the width of the insulating film 50 becomes maximum.

Now, the stacked body LM in which a plurality of different types of layers is stacked in multiple layers, and the insulating film 50 having a relatively large volume, may have produced therein different sorts of stress. The stacked body LM is formed typically by stacking a plurality of sacrificial layers such as a silicon nitride layer and a plurality of insulating layers OL, and then by replacing the sacrificial layers with conductive layers to form the word lines WL. Difference of the stresses between the stacked body LM and the insulating film 50 becomes distinctive, in the process of such replacement.

Hence, in a part of the staircase portion SP illustrated in FIG. 2B, the plate-like contact LI that divides the staircase region SR in the Y direction tends to have a tapered shape with a compressed upper end and swollen lower end, due to stress that emerges during the replacement for forming the stacked body LM. On the other hand, the plate-like contacts LI neighboring both ends in the Y direction of the plate-like contact LI, are arranged in the stacked body LM, and therefore tends to have a tapered shape with a swollen upper end and compressed lower end.

Again in a part of the staircase portion SP illustrated in FIG. 2B, the upper parts of the columnar portions HR tend to be attracted towards the plate-like contact LI that divides the staircase region SR in the Y direction, due to stress that emerges during the replacement for forming the stacked body LM, making the columnar portions HR more likely to incline towards the plate-like contact LI. In contrast, the contacts CC are formed typically after the replacement for forming the stacked body LM, without being affected by the stress during the replacement for forming the stacked body LM, and can therefore extend in the insulating film 50 substantially vertically.

Note that FIG. 2B illustrates only the columnar portions HR arranged in the vicinity of the plate-like contact LI that divides the staircase region SR in the Y direction. The columnar portions HR are, however, dispersedly arranged over the entire staircase region SR.

FIG. 2C is a cross-sectional view in the Y direction, illustrating a portion where the word lines WL in the middle layer of the staircase portion SP are terraced. In a part of the staircase portion SP illustrated in FIG. 2C, the valley-like shape in the staircase region SR is shallower than in the part of the staircase portion SP illustrated in FIG. 2B, and the width of the valley-like shape in the Y direction is narrower than in the part of the staircase portion SP illustrated in FIG. 2B. In this part, also the insulating film 50 becomes thinner and narrower, than in the part of the staircase portion SP illustrated in FIG. 2B.

Hence, in the part of the staircase portion SP illustrated in FIG. 2C, the difference of the stresses between the stacked body LM and the insulating film 50, that emerges during the replacement for forming the stacked body LM, is smaller than in the part illustrated in FIG. 2B. In this part, also the inclination of the columnar portion HR towards the plate-like contact LI that divides the staircase region SR in the Y direction, is moderated than that of the columnar portions HR in the part of the staircase portion SP illustrated in FIG. 2B.

Note that also FIG. 2C illustrates only the columnar portions HR arranged in the vicinity of the plate-like contact LI that divides the staircase region SR in the Y direction.

The aforementioned difference of the stresses between the stacked body LM and the insulating film 50, which emerges during the replacement for forming the stacked body LM, can also affect the memory region MR and the select gate contact region SGR. FIG. 2A uses arrows to indicate magnitude and direction of the stress exerted on the memory region MR and the select gate contact region SGR.

As illustrated in FIG. 2A, in the memory region MRs and the select gate contact region SGRs neighboring the staircase region SR without placing the through-contact region TP in between, the memory region MRs and the select gate contact region SGRs are subjected to the stress that acts towards the plate-like contact LI that divides the staircase region SR in the Y direction. Moreover, the select gate contact region SGRs, positioned closer to the staircase region SR than the memory region MRs, may be more largely affected by such stress. In the memory region MRs, the aforementioned influence of the stress appears more distinctive, as the position comes closer to the staircase region SR.

For this reason, also the pillars PL and the columnar portions HR, respectively arranged in the memory region MRs and the select gate contact region SGRs, may incline towards the plate-like contact LI that divides the staircase region SR in the Y direction.

FIG. 2D is a cross-sectional view taken in the Y direction, at the memory region MRs closer to the staircase region SR. As illustrated in FIG. 2D, in the memory region MR (MRs, MRt), isolation layers SHE extend substantially in a direction along the X direction, so as to isolate the upper portion of the stacked body LM between the plate-like contacts LI neighboring in the Y direction, into a plurality of sections of the select gate lines SGD. Each isolation layer SHE extends from the memory region MR (MRs, MRt) to the select gate contact region SGR (SGRs, SGRt), and reaches the staircase region SR or the through-contact region TP neighboring the select gate contact region SGR.

In addition, the portion of the memory region MRs illustrated in FIG. 2D comes under relatively large stress, during the replacement for forming the stacked body LM, as compared for example with a portion away in the X direction from the staircase region SR. Hence, the pillars PL arranged in this portion of the memory region MRs tend to cause relatively large inclination towards the plate-like contacts LI that divide the staircase region SR in the Y direction.

FIG. 2E is a cross-sectional view taken in the Y direction at the select gate contact region SGRs. In the select gate contact region SGRs neighboring the staircase region SR in the X direction, the stress during the replacement for forming the stacked body LM is more strongly exerted. Hence, the columnar portions HR arranged in the select gate contact region SGRs tend to more largely incline towards the plate-like contacts LI that divide the staircase region SR in the Y direction.

Note in the select gate contact region SGR, the upper portion of the stacked body LM is isolated into a plurality of sections of the select gate lines SGD by the isolation layers SHE, and such individual sections of the select gate lines SGD have arranged therein the contacts CC that are connected to these select gate lines SGD.

While FIG. 2E illustrates several columnar portions HR arranged in each of the sections isolated by one isolation layer SHE, the plurality of columnar portions HR is also arranged in the select gate contact region SGR in an entirely distributed manner.

Also in the memory region MR and the select gate contact region SGR neighboring the staircase region SR in the X direction while placing the through-contact region TP in between (the memory region MRt and the select gate contact region SGRt in FIG. 1), the memory region MRt and the select gate contact region SGRt are subjected to the stress that acts towards the plate-like contact LI that divides the staircase region SR in the Y direction.

Also in a case where the through-contact region TP is arranged in between, the select gate contact region SGRt, which is closer to the staircase region SR than the memory region MRt, will be more distinctly affected by such stress. Meanwhile in the memory region MRt, such influence of the stress becomes more distinctive as the position comes closer to the staircase region SR.

Hence, also in these memory region MRt and the select gate contact region SGRt, the pillars PL and the columnar portions HR tend to incline towards the plate-like contact LI that divides the staircase region SR arranged in the X direction while placing the through-contact region TP in between, depending on the magnitude of the stress, that is, the distance in the X direction from the staircase region SR.

Note however that the influence of such stress is smaller than in the memory region MRs and the select gate contact region SGRs neighboring the staircase region SR in the X direction, without placing the through-contact region TP in between.

Figure 3:
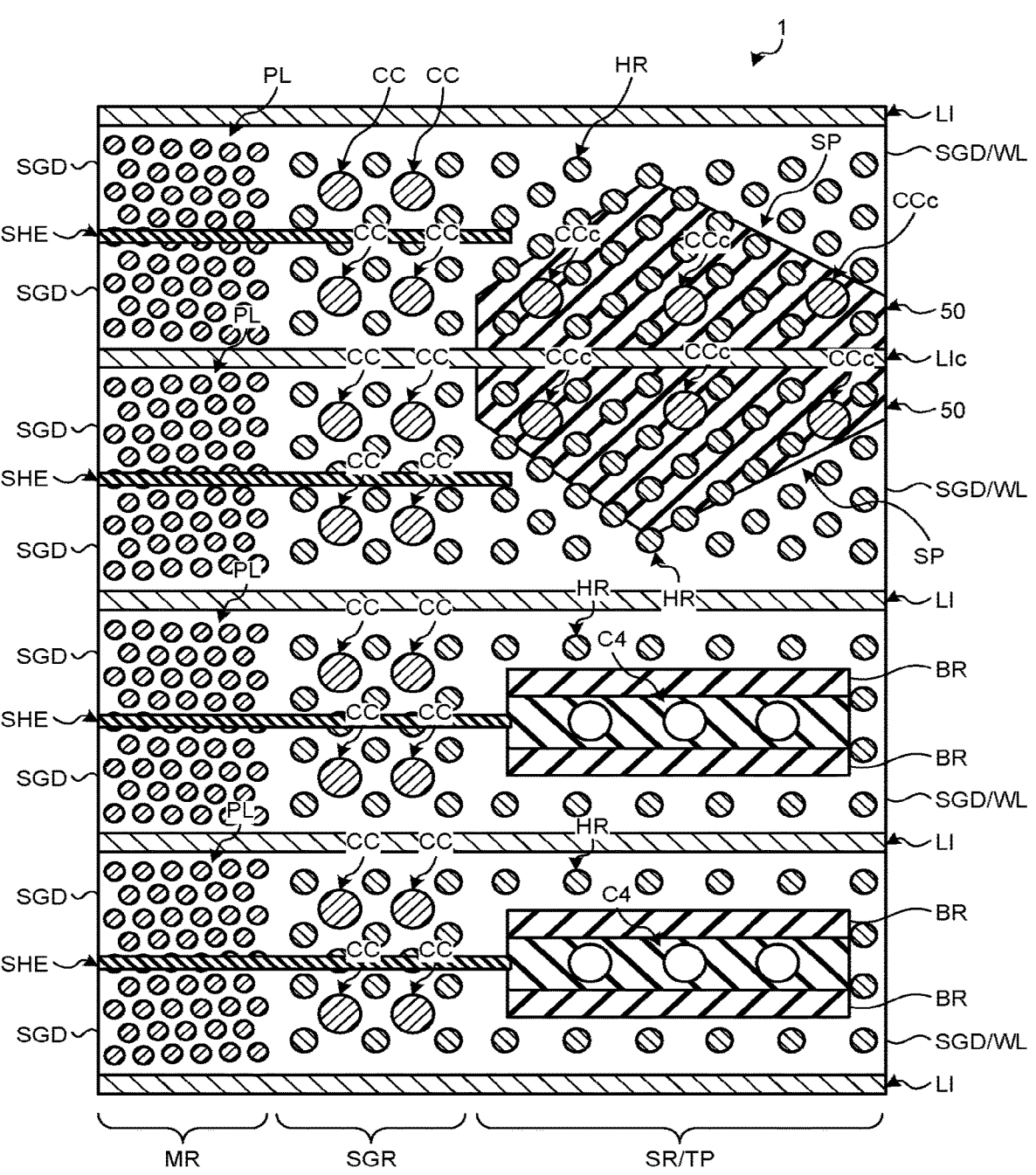
FIG. 3 is a schematic drawing illustrating an exemplary structure of a staircase region of the semiconductor memory device according to the first embodiment.

FIG. 3 illustrates a detailed structure of the staircase region SR under such influence of the stress. FIG. 3 is a schematic drawing illustrating an exemplary structure of the staircase region SR of the semiconductor memory device 1 according to the first embodiment.

More specifically, FIG. 3 is a top view that contains a part of the memory region MR, the select gate contact region SGR, a part of the staircase region SR, and a part of the through-contact region TP. That is, FIG. 3 illustrates partial regions of two fingers FGR having the staircase region SR, and two fingers FGR having the through-contact regions TP, totaling four fingers FGR.

Among five plate-like contacts LI illustrated in FIG. 3, the plate-like contact LI that overlaps, in the stacking direction of the stacked body LM, the staircase region SR neighboring the memory region MR and the select gate contact region SGR in the X direction, without placing the through-contact region TP in between, and divides the staircase region SR in the Y direction, is also referred to as a center contact LIc.

Note that FIG. 3 does not illustrate an upper structure that contains the plugs connected typically to the pillars PL, the plate-like contacts LI, and the contacts CC.

As illustrated in FIG. 3, the plurality of pillars PL is dispersedly arranged in the memory region MR, between the plate-like contacts LI neighboring in the Y direction. The plurality of pillars PL is arranged typically in a staggered manner, when viewed in the stacking direction of the stacked body LM.

Now, the plurality of pillars PL is affected by the difference of the stresses between the stacked body LM and the insulating film 50, which occurs during the replacement for forming the stacked body LM. Hence, in some cases, the arrays of the plurality of pillars PL, designed to be aligned linearly in a direction along the X direction, would approach the plate-like contact LI that divides the staircase region SR in the Y direction, that is, the center contact LIc, as the position comes closer to the staircase region SR.

Hence, the positions of placement in the Y direction of the individual pillars PL, aligned in a direction along the X direction, approach stepwise towards the center contact LIc, as the position comes closer to the staircase region SR. Note that the positions of placement of the pillars PL are defined by the positions of the upper ends thereof. The same will apply to the positions of placement of the pillars PL and the columnar portions HR described below.

Such a plurality of pillars PL follows a mutually inverted arrangement on both sides of the center contact LIc in the Y direction. That is, such arrangement of the plurality of pillars PL is substantially line-symmetric with respect to the center contact LIc.

In the semiconductor memory device 1, the pillars PL having the MANOS structure, and the plate-like contacts LI are arranged a predetermined distance away from each other, so as to avoid electrical conduction.

Between the plate-like contacts LI neighboring in the Y direction, the memory region MR and the select gate contact region SGR have, arranged therein, the isolation layer SHE that penetrates the select gate line SGD in the upper portion of the stacked body LM.

The isolation layer SHE is constituted by an insulating layer that typically penetrates the select gate line SGD, extends in a direction along the X direction in the memory region MR and the select gate contact region SGR, and reaches the staircase region SR or the through-contact region TP neighboring in the X direction. As described above, the isolation layer SHE penetrates, between the plate-like contacts LI neighboring in the Y direction, one or more conductive layers that contains the uppermost conductive layer of the stacked body LM, to isolate these conductive layers into a plurality of sections of the select gate lines SGD.

The isolation layer SHE that extends in a direction along the X direction in the memory region MR is arranged, for example, at positions that overlap some of the pillars PL, when viewed in the stacking direction of the stacked body LM. In this case, these pillars PL will have no plugs, upper wirings or the like connected thereto, and will have no effective memory cells formed therein. Hence, the pillars PL that overlap the isolation layer SHE become dummy pillars that do not contribute to the function of the semiconductor memory device 1.

Such interference between the isolation layer SHE and some of the pillars PL is accepted, for the purpose of densely as possible arranging the pillars, while maintaining a periodic pattern, such as a staggered pattern, of the pillars PL.

Between the plate-like contacts LI neighboring in the Y direction, the plurality of columnar portions HR is dispersedly arranged in the select gate contact region SGR and the staircase region SR. The plurality of columnar portions HR is typically arranged to form a grid pattern or a staggered pattern, when viewed in the stacking direction of the stacked body LM.

Note that also the plurality of columnar portions HR is affected by the aforementioned difference of stress that occurs between the stacked body LM and the insulating film 50 during the replacement for forming the stacked body LM. Hence, in some cases, the arrays of the plurality of columnar portions HR, designed to be aligned linearly in a direction along the X direction, would approach the center contact LIc, as the position in the select gate contact region SGR comes closer to the staircase region SR.

Hence, in the select gate contact region SGR, the positions of placement in the Y direction of the individual columnar portions HR, aligned in a direction along the X direction, approach stepwise towards the center contact LIc, as the position comes closer to the staircase region SR.

In addition, such a plurality of columnar portions HR follows a mutually inverted arrangement on both sides of the center contact LIc in the Y direction. That is, such arrangement of the plurality of columnar portions HR is substantially line-symmetric with respect to the center contact LIc.

In the staircase region SR, the arrays of the plurality of columnar portions HR aligned in a direction along the X direction may occasionally approach towards the center contact LIc, as the position comes closer to a portion where the lower word lines WL, the select gate lines SGS and so forth of the staircase portion SP are terraced, and the staircase length in the Y direction of the staircase part becomes maximum.

Hence, the positions of placement in the Y direction of the individual columnar portions HR arranged in a direction along the X direction approach stepwise towards the center contact LIc, as the position comes closer to a portion where the lower word lines WL and so forth of the staircase portion SP are terraced, and the staircase length in the Y direction of the staircase part becomes maximum.

Also such a plurality of columnar portions HR follows a mutually inverted arrangement on both sides of the plate-like contact LI in the Y direction. That is, such arrangement of the plurality of columnar portions HR is substantially line-symmetric with respect to the center contact LIc.

Hence, the columnar portions HR in the staircase region SR approach the center contact LIc on both sides in the Y direction across the center contact LIc, from one end in the X direction of the staircase region SR, towards a portion where the staircase length in the Y direction of the staircase part becomes maximum, meanwhile again depart away from the center contact LIc, from a portion where the staircase length in the Y direction of the staircase part becomes maximum, towards the other end in the X direction of the staircase region SR.

In the semiconductor memory device 1, the columnar portions HR having the MANOS structure, and the plate-like contacts LI are arranged a predetermined distance away from each other, so as to avoid electrical conduction. The columnar portion HR arranged in the staircase region SR solely composed of the insulating layer, and the plate-like contact LI are, however, allowed to interfere to some extent.

Between the plate-like contacts LI neighboring in the Y direction, in the select gate contact region SGR and the staircase region SR, and on the terrace faces of the terraced word lines WL and the select gate lines SGD and SGS, there is the plurality of contacts CC arranged so as to be individually connected to the plurality of word lines WL and the select gate lines SGD and SGS.

In the select gate contact region SGR, out of the select gate contact region SGR and the staircase region SR, one or more select gate lines SGD further above the uppermost word line WL are terraced, with one or more contacts CC individually connected to the select gate lines SGD.

In the staircase region SR, out of the select gate contact region SGR and the staircase region SR, a plurality of word lines WL, one or more select gate lines SGD further above the uppermost word line WL, and one or more select gate lines SGS further below the lowermost word line WL are terraced, with the plurality of contacts CC individually connected to the word lines WL and the select gate lines SGS.

These contacts CC are arranged in the staircase portion SP that extends in the X direction, in the staircase region SR and on the side thereof away in the X direction from the memory region MR and the select gate contact region SGR. As described previously, the staircase portion SP descends towards the memory region MR and the select gate contact region SGR. Hence, the contacts CC connected to the upper word lines WL, out of the plurality of contacts CC arranged in the staircase portion SP, are arranged near the end of the staircase region SR, typically on the side thereof away in the X direction from the memory region MR and the select gate contact region SGRs.

Now, at least some of the contacts CC in the staircase region SR are arranged so as to avoid interference with the columnar portions HR having been subjected to the stress during the replacement for forming the stacked body LM. That is, the positions of placement of the plurality of contacts CC aligned in the X direction along the center contact LIc vary stepwise from one end to the other end in the X direction of the staircase portion SP, in accordance with the arrangement of the columnar portions HR, while avoiding interference with the plurality of columnar portions HR.

That is, these columnar portions HR are arranged so as to approach stepwise towards the center contact LIc, as the position comes closer to a portion where the lower word lines WL and so forth of the staircase portion SP are terraced, and the staircase length in the Y direction of the staircase part becomes maximum. In the exemplary case illustrated in FIG. 3, three contacts CCc arranged in the X direction in the staircase region SR are arranged closer to the center contact LIc, so as to avoid interference with the columnar portions HR.

Similarly to the arrangement of the plurality of columnar portions HR, also the plurality of contacts CC including the contacts CCc follows a mutually inverted arrangement on both sides of the plate-like contact LI in the Y direction. That is, such arrangement of the plurality of contacts CC is substantially line-symmetric with respect to the center contact LIc.

Hence, the contacts CC in the staircase region SR approach the center contact LIc on both sides in the Y direction across the center contact LIc, from one end in the X direction of the staircase region SR, towards a portion where the staircase length in the Y direction of the staircase part becomes maximum, meanwhile again depart away from the center contact LIc, from the portion where the staircase length in the Y direction of the staircase part becomes maximum, towards the other end in the X direction.

As described previously, in a case where the positions in the Y direction of the plurality of contacts CC are adjusted in accordance with the surrounding columnar portions HR, the positions of placement in the Y direction of the plurality of contacts CC may be determined typically on the basis of a stress simulation for the insulating film 50 filled in the staircase region SR and the surrounding stacked body LM. The positions of placement of the plurality of contacts CC in the Y direction may alternatively be determined, on the basis of actual measurement values obtained by measuring the positional deviation of the columnar portions HR found typically in a prototype of the semiconductor memory device 1.

When adjusting the positions of placement in the Y direction of the contacts CCc in accordance with the columnar portions HR, the position may be adjusted for each of the contacts CCc. Alternatively, the positions of placement in the Y direction of the contacts CCc may be adjusted group-wise, after dividing the contacts CCc into a plurality of groups each containing a predetermined number of contacts CCc. That is, the positions in the Y direction of the plurality of contacts CCc contained in one group are substantially constant with respect to the neighboring center contact LIC. This sort of grouping may rely upon the levels of stacking, such as lower, middle, or upper, of the plurality of word lines WL in the stacked body LM.

(Method for Manufacturing Semiconductor Memory Device)

Figure 4:
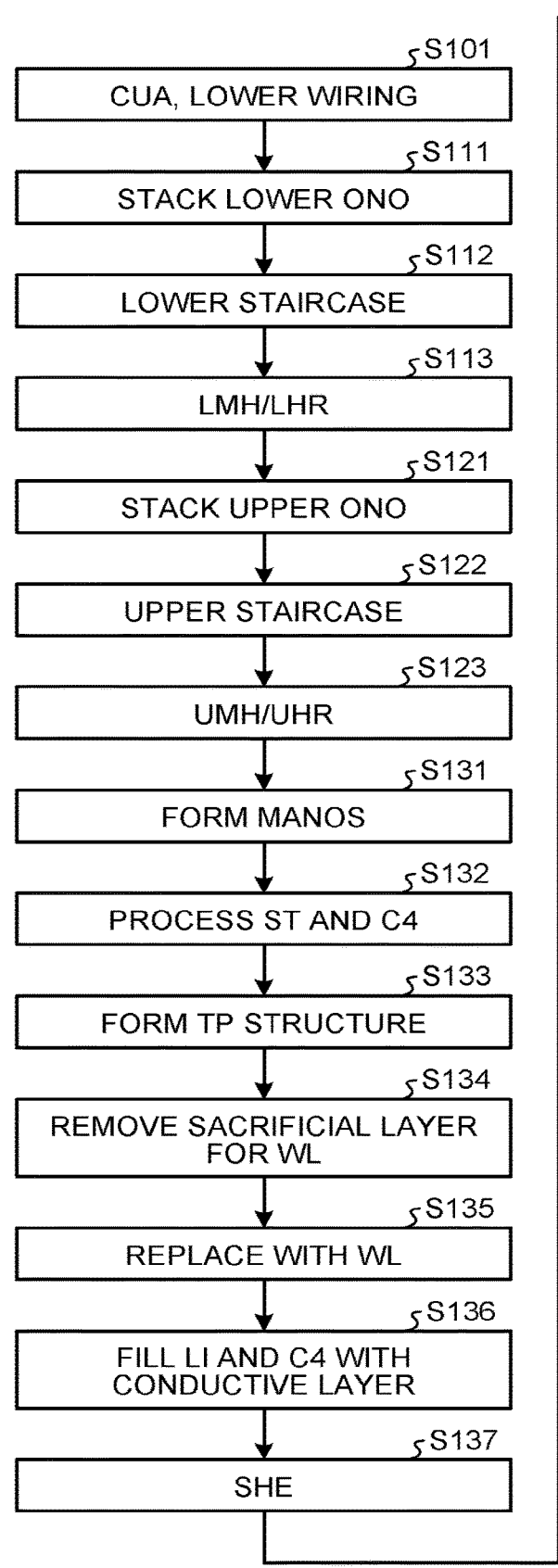
FIG. 4 is a flow chart exemplifying a part of procedures of a method for manufacturing the semiconductor memory device according to the first embodiment.
Figure 4:
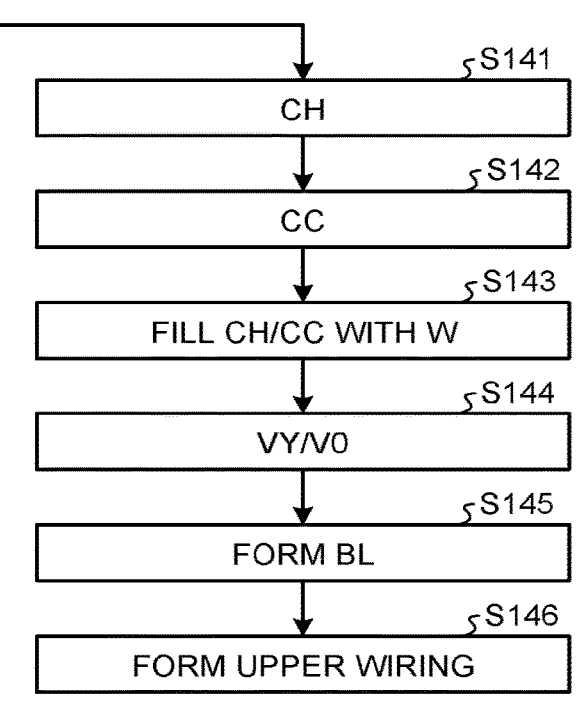

Next, a method for manufacturing the semiconductor memory device 1 according to the first embodiment will be explained referring to FIG. 4. FIG. 4 is a flow chart exemplifying a part of procedures of the method for manufacturing the semiconductor memory device 1 according to the first embodiment.

As illustrated in FIG. 4, the peripheral circuit CUA, the lower wiring and so forth are formed on a substrate SB such as a silicon substrate (step S101). The peripheral circuit CUA, the lower wirings and so forth are covered with the insulating film 40. On the insulating film 40, the source line SL is formed.

Next, a plurality of sacrificial layers such as silicon nitride layers, and a plurality of insulating layers OL are alternately stacked above the source line SL to form a lower ONO structure, thereby forming a first-tier stacked body (step S111). Also a lower staircase portion is formed in the first-tier stacked body, and the thus produced recess is filled with the insulating film 50 (step S112).

In the first-tier stacked body, also a lower pillar LMH which is a lower structure of the pillar PL, and the lower columnar portion LHR which is a lower structure of the columnar portion HR, are formed (step S113). Note, the lower pillar LMH and the lower columnar portion LHR in this stage are filled with a sacrificial layer such as an amorphous silicon layer.

Next, a plurality of sacrificial layers such as silicon nitride layers, and a plurality of insulating layers OL are alternately stacked above the first-tier stacked body to form an upper ONO structure, thereby forming a second-tier stacked body (step S121). Also an upper staircase portion is formed in the second-tier stacked body, and the thus produced recess is filled with the insulating film 50 (step S122).

Also memory holes and holes, which are converted later to the upper pillar UMH which is an upper structure of the pillar PL, and to the upper columnar portion UHR which is an upper structure of the columnar portion HR, are respectively formed in the second-tier stacked body (step S123). Through these memory holes and the holes, the sacrificial layers having been filled in the lower pillar LMH and the lower columnar portion LHR are removed.

Next, the MANOS structure is formed in the lower pillar LMH and the upper pillar UMH, as well as in the lower columnar portion LHR and the upper columnar portion UHR of the select gate contact region SGR, thereby forming the pillars PL and the columnar portions HR (step S131). On the other hand, in the staircase region SR, there are formed the columnar portions HR having the lower columnar portion LHR and the upper columnar portion UHR filled with the insulating layer.

Next, slits ST that penetrate the stacked body having the two-tire structure, and through-holes which are converted later to through-contacts C4 are formed (step S132). Between the slits ST neighboring in the Y direction, a barrier layer is formed so as to sandwich a region where the through-contact C4 will be formed later from both sides in the Y direction, thereby reserving a region that will serve later as the through-contact region TP (step S133).

Next, a removal liquid such as hot phosphoric acid is infused through the slits ST, to remove the sacrificial layer in the stacked body (step S134). A source gas such as tungsten is introduced through the slits ST, to form the plurality of word lines WL and so forth, to a part where the sacrificial layer has been removed (step S135).

As a result of such replacement, obtainable is the stacked body LM having the two-tire structure, in which the plurality of word lines WL and the plurality of insulating layers OL are alternately stacked. Meanwhile, the region sandwiched by the barrier layer is prevented from infiltration of the removal liquid for the sacrificial layer and the source gas of tungsten or the like. Hence, the stacked body having stacked therein the plurality of sacrificial layers and the plurality of insulating layers OL may be kept intact, and will later serve as the through-contact region TP.

During the replacement, the upper end portion of the slits ST that divide the staircase region SR in the Y direction may be compressed, so that a structure that contains the pillars PL and the columnar portions HR that belong to the fingers FGR on both sides in the Y direction of the slits ST may incline towards the slits ST, while being affected by the stress.

Next, a liner layer such as an insulating layer is formed in the slits ST and the through-holes, and a conductive layer is further filled, to respectively form the plate-like contacts LI and the through-contacts C4 (step S136). Also the isolation layers SHE that extend in a direction along the X direction in the memory region MR, and reach the staircase region SR are formed (step S137). One or a plurality of select gate lines SGD is thus formed in the upper portion of the stacked body LM.

Next, holes in which are converted later to the plugs CH that connect to the upper end of the pillars PL are formed, in an upper layer above the stacked body LM (step S141). Also the plurality of contact holes that will serve later as the contacts CC is formed in the staircase region SR and the select gate contact region SGR (step S142). In this process, the contact holes may be formed while being aligned with the columnar portion HR having been misaligned.

Next, a liner layer such as an insulating layer is formed in these holes and contact holes, and a conductive layer such as tungsten is further filled. The plugs CH individually connected to the plurality of pillars PL, and the contacts CC individually connected to the plurality of word lines WL and the select gate lines SGD and SGS are thus formed (step S143). These contacts CC may include contacts CCc arranged to avoid interference with the misaligned columnar portions HR.

Next, plugs VY and V0 that are connected to the plugs CH and the contacts CC, respectively, are formed in a layer further above the plugs CH (step S144). Also bit lines BL connected to the plugs VY are formed in a layer further above the plugs VY (step S145). Also upper wirings connected to the plugs V0 are formed in a layer further above the plugs V0 (step S146).

The semiconductor memory device 1 of the first embodiment is thus manufactured.

Note that the order of processes illustrated in FIG. 4 is merely an exemplary one which may be suitably modified. For example, the order of the process of step S112 and the process of step S113 is interchangeable, and also the order of the process of step S122 and the processes of steps S123 and S131 is interchangeable. Also the order of the process of step S141 and the process of step S142 may be interchanged.

In some process of manufacturing a semiconductor memory device such as a three-dimensional nonvolatile memory, the stacked body having the conductive layers and insulating layers stacked therein may be formed by replacing the sacrificial layers in the stacked body with the conductive layers. In this case, difference in stresses may emerge between the insulating layer filled in the staircase region and the surrounding stacked body, during the replacement for forming the stacked body.

Hence, the structure including the columnar portions formed to support the stacked body during the replacement typically in the staircase region would shift in a direction along the Y direction while being affected by the stress, and this would result in contact typically with the word line contacts formed thereafter.

For example, if the lower ends of the columnar portion and the word line contact come into contact, the contact would penetrate, via the lower end of the columnar portion, the word line to be connected, and would reach the word line further in the lower layer. This would cause short-circuiting or leakage current between the word lines in different layers.

According to the semiconductor memory device 1 of the first embodiment, the plurality of contacts CC is arranged along the plate-like contact LI that divides the staircase region SR in the Y direction, on one side in the Y direction of the plate-like contact LI, and at different positions in the Y direction from the plate-like contact LI, depending on the positions in the X direction. Meanwhile on the other side in the Y direction of the plate-like contact LI, the plurality of contacts CC is arranged along the plate-like contact LI, at positions inverted in the Y direction from the respective positions of the plurality of contacts CC arranged on one side of the plate-like contact LI, with respect to the plate-like contact LI.

By thus arranging the contacts CC unlikely to be affected by the difference of stresses between the insulating film 50 filled in the staircase region SR, and the surrounding stacked body LM, while avoiding interference with the columnar portions HR possibly affected by the stress, it now becomes possible to suppress contact between the contacts CC and the columnar portions HR. This successfully suppresses the contacts CC from penetrating, for example, the word lines WL to be connected, and suppresses the short-circuiting and leakage current at the word lines WL.

According to the semiconductor memory device 1 of the first embodiment, the positions of placement in the Y direction of the plurality of columnar portions HR arranged along the plate-like contact LI vary stepwise from one end towards the other end in the X direction of the staircase portion SP, and the positions of placement of the plurality of contacts CC arranged along the plate-like contact LI vary in accordance with the positions of placement of the plurality of columnar portions HR.

Hence, even if the positions of placement of the plurality of columnar portions HR deviate due to the stress during the replacement for forming the stacked body LM, the positions of placement of the plurality of contacts CC are aligned thereto, making it possible to properly maintain the positional relation between these structures.

MODIFIED EXAMPLE

Next, a semiconductor memory device according to a modified example of the first embodiment will be explained, referring to FIGS. 5 and 6. The semiconductor memory device of the modified example is different from the first embodiment, in that also the positions of placement of the contacts CC arranged in the select gate contact region SGR1 are corrected in accordance with the deviated columnar portions HR.

Figure 5:
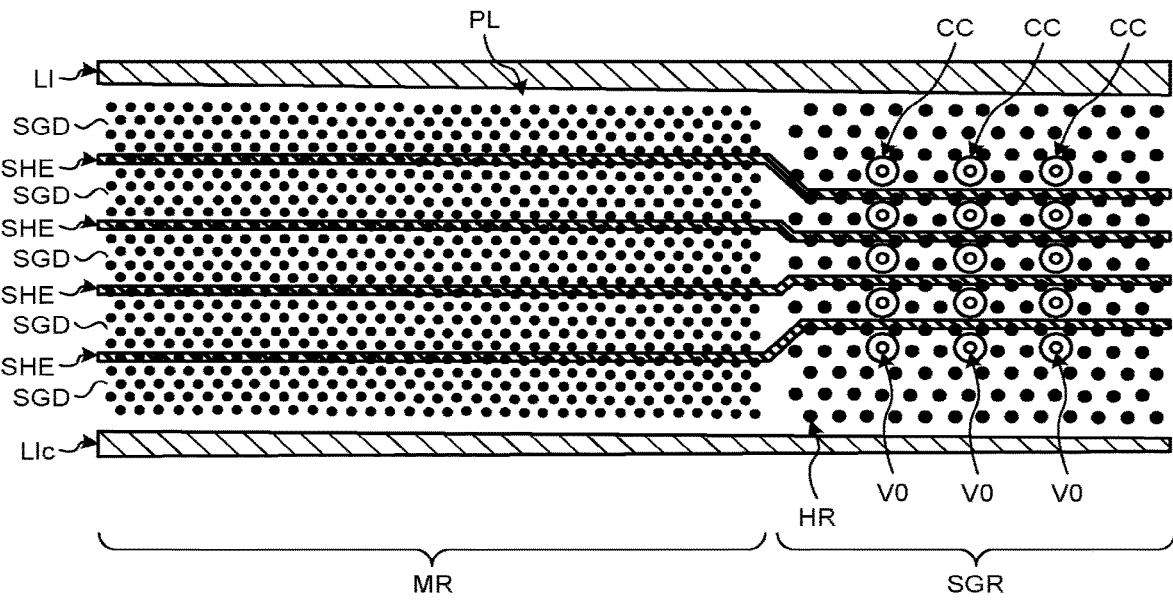
FIG. 5 is a schematic drawing illustrating an exemplary structure of a select gate contact region of the semiconductor memory device according to the first embodiment, with an arrangement of contacts left unadjusted.

FIG. 5 is a schematic drawing illustrating an exemplary structure of the select gate contact region SGR of the semiconductor memory device according to the first embodiment, with an arrangement of the contacts CC left unadjusted. FIG. 6 is a schematic drawing illustrating an exemplary structure of the select gate contact region SGR1 of the semiconductor memory device according to the modified example of the first embodiment, with an arrangement of the contacts CC adjusted.

Figure 6:
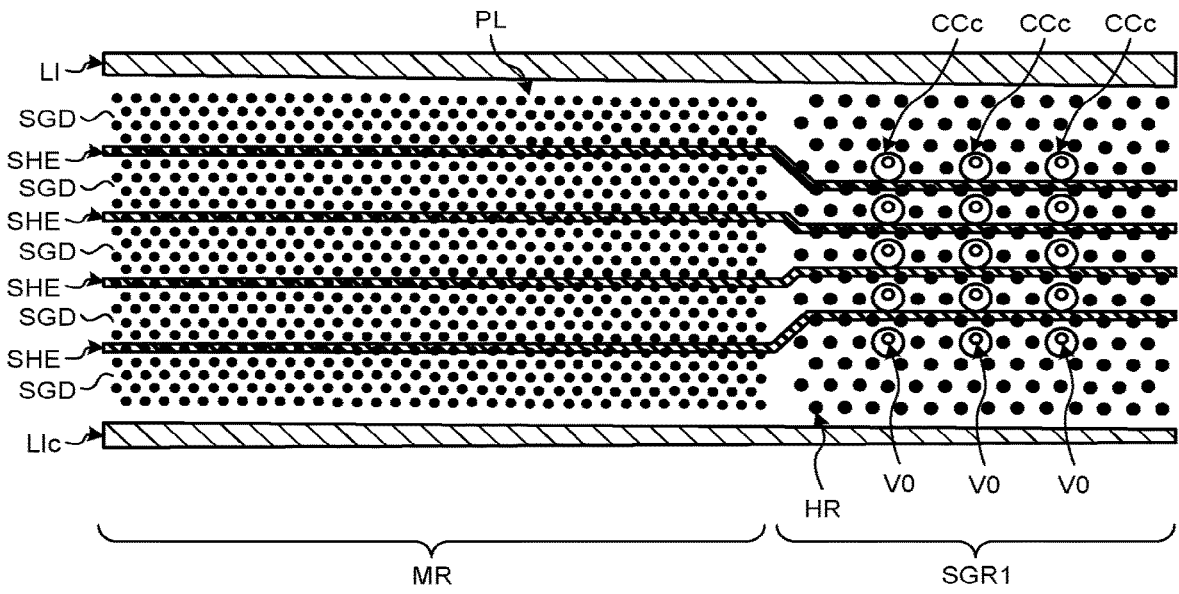
FIG. 6 is a schematic drawing illustrating an exemplary structure of a select gate contact region of a semiconductor memory device according to a modified example of the first embodiment, with an arrangement of the contacts adjusted.

More specifically, FIGS. 5 and 6 are top views that contain a part of the memory region MR and the select gate contact regions SGR and SGR1, neighboring the staircase region SR, with or without the through-contact region TP arranged in between. Since some stress acts on the select gate contact region SGR regardless of whether the through-contact region TP is arranged between the select gate contact region SGR and the staircase region SR, so that the positional correction below may be made on whichever contacts CC in the select gate contact regions SGRs and SGRt.

Note, FIGS. 5 and 6 do not illustrate an upper structure that contains plugs CH and VY connected typically to the pillars PL and the plate-like contact LI, and an upper structure connected to the plugs V0 above the contacts CC. Also note that, while the aforementioned FIG. 3 has illustrated a simplified top view of the semiconductor memory device 1, FIGS. 5 and 6 will illustrate more detailed top views.

Also note that, all structures in FIGS. 5 and 6, similar to those in the aforementioned first embodiment, will have same reference signs, to skip the explanation.

As illustrated in more detail in FIG. 5, the exemplary structure contains 24 rows of pillars PL arranged in a direction along the X direction, in a region between the plate-like contacts LI neighboring in the Y direction. Again in the region between the plate-like contacts LI neighboring in the Y direction, one or a plurality of conductive layers, including the uppermost conductive layer of the stacked body LM, is isolated by four isolation layers SHE into five sections of the select gate lines SGD.

The four isolation layers SHE that extend in a direction along the X direction in the memory region MR, and isolate the conductive layers in the memory region MR into five nearly at regular intervals, are converged in the select gate contact region SGR towards the center between the plate-like contacts LI neighboring in the Y direction, and in accordance with this, the plurality of contacts CC is arranged in a region between the isolation layers SHE to form a grid pattern, for example, when viewed in the stacking direction of the stacked body LM.

On the top faces of these contacts CC, there are arranged the plugs V0 that connect the contacts CC with the unillustrated upper wiring. When viewed from the stacking direction of the stacked body LM, the center positions of the contacts CC and the center positions of the plugs V0 connected to the contacts CC are substantially aligned.

As illustrated in FIG. 6, in the select gate contact region SGR1, the positions of placement of the plurality of contacts CCc arranged in the X direction are adjusted in accordance with the positions of placement of the plurality of columnar portions HR arranged in the X direction. As described above, in the select gate contact region SGR1, also the columnar portions HR arranged along the center contact LIc approach the center contact LIc more largely as the position comes closer to the staircase region SR. The positions of placement of the plurality of contacts CCc arranged along the center contact LIc vary, in accordance with the positions of placement of the columnar portions HR.

That is, in the select gate contact region SGR1, the positions of placement in the Y direction of the plurality of contacts CCc arranged in the X direction approach the center contact LIc more largely as the position comes closer to the staircase region SR. Hence, when viewed in the stacking direction of the stacked body LM, the center positions of the plugs V0 are misaligned with the center positions of the contacts CCc to which the plugs V0 are connected, in the direction away from the center contact LIc.

Also in the select gate contact region SGR1, the plurality of contacts CCc follows a mutually inverted arrangement on both sides of the center contact LIc in the Y direction. That is, such arrangement of the plurality of contacts CCc is substantially line-symmetric with respect to the center contact LIc.

According to the semiconductor memory device of the modified example, the contacts CCc unlikely to be affected by the stress during the replacement for forming the stacked body LM are arranged while avoiding interference with the columnar portions HR possibly affected by the stress, also in the select gate contact region SGR1. This successfully maintains proper positional relation among these structures.

According to the semiconductor memory device of the modified example, any other effects same as those of the semiconductor memory device 1 of the first embodiment can be obtained.

Second Embodiment

Hereinafter, the second embodiment will be detailed referring to the attached drawings. The semiconductor memory device of the second embodiment is different from the first embodiment, in that the positions of placement of the isolation layers are adjusted in accordance with the positional deviation of the pillars in the memory region.

(Exemplary Structure of Semiconductor Memory Device)

Figure 7:
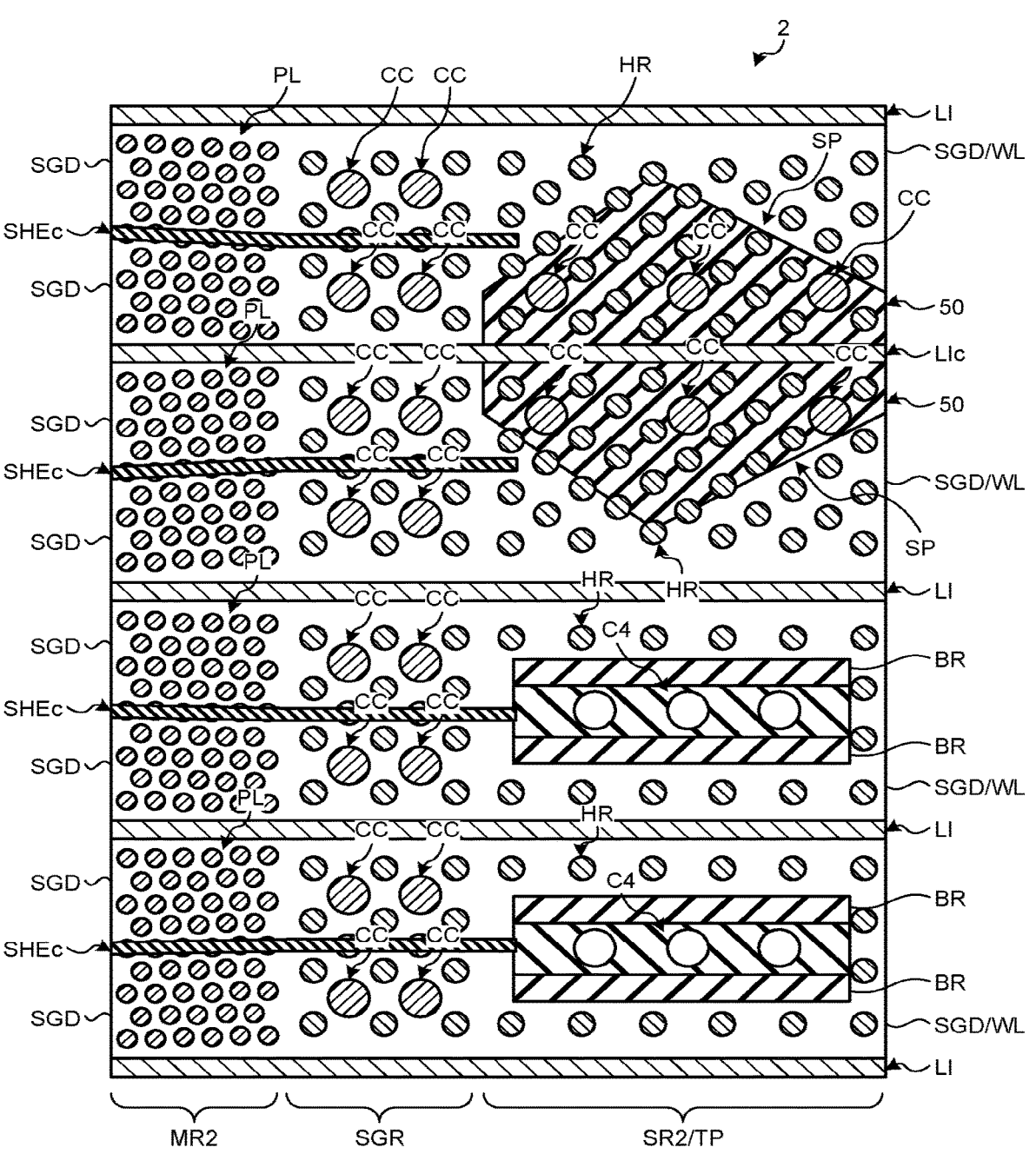
FIG. 7 is a schematic drawing illustrating an exemplary structure of a memory region of a semiconductor memory device according to a second embodiment.

FIG. 7 is a schematic drawing illustrating an exemplary structure of a memory region MR2 of a semiconductor memory device 2 according to the second embodiment. More specifically, FIG. 7 is a top view that contains a part of the memory region MR2, the select gate contact region SGR, a part of a staircase region SR2, and a part of the through-contact region TP.

Note, FIG. 7 does not illustrate an upper structure that contains the plugs CH, VY and V0 connected typically to the pillars PL, the plate-like contacts LI, and the contacts CC. Now, in the semiconductor memory device 2 of the second embodiment, the positions of placement of the contacts CC in the staircase region SR2 are not adjusted in accordance with the columnar portions HR unlike the first embodiment, instead being left unadjusted typically as designed.

Also note that all structures in FIG. 7 same as those in first embodiment will have same reference signs, to skip the explanation.

As illustrated in FIG. 7, also in the memory region MR2 of the semiconductor memory device 2 of the second embodiment, the positions of placement in the Y direction of the pillars PL arranged in a direction along the X direction approach the center contact LIc more largely as the position comes closer to the staircase region SR2, like in the afore-mentioned first embodiment.

Also in the select gate contact region SGR and the staircase region SR2 of the semiconductor memory device 2, the positions of placement in the Y direction of the columnar portions HR arranged in a direction along the X direction vary depending on the positions of placement in the X direction of these columnar portions HR, like in the afore-mentioned first embodiment.

On the other hand, in the memory region MR2 of the semiconductor memory device 2 of the second embodiment, the isolation layer SHEc has a predetermined portion that extends along the center contact LIc in accordance with the pillars PL having been affected by the stress during the replacement for forming the stacked body LM, with the distance in the Y direction from the center contact LIc continuously varied depending on the position in the X direction of the isolation layer SHEc. That is, the portion of the isolation layer SHEc closer to the staircase region SR2 approaches the center contact LIc more largely as the position comes closer to the staircase region SR2.

More specifically, in the memory region MR2 neighboring the staircase region SR2 without placing the through-contact region TP in between, the pillars PL are more largely affected by the stress, and more largely deviated. Hence, the positions of placement of the isolation layer SHEc are determined so that also the amount of deviation of the isolation layer SHEc increases in accordance with the pillars PL.

In contrast, in the memory region MR2 neighboring the staircase region SR2 while placing the through-contact region TP in between, the influence of stress is relatively small, only to cause a relatively small deviation of the pillars PL. Hence, the positions of placement of the isolation layer SHEc are determined so that also the amount of deviation of the isolation layer SHEc decreases in accordance with the pillars PL.

Figure 8:
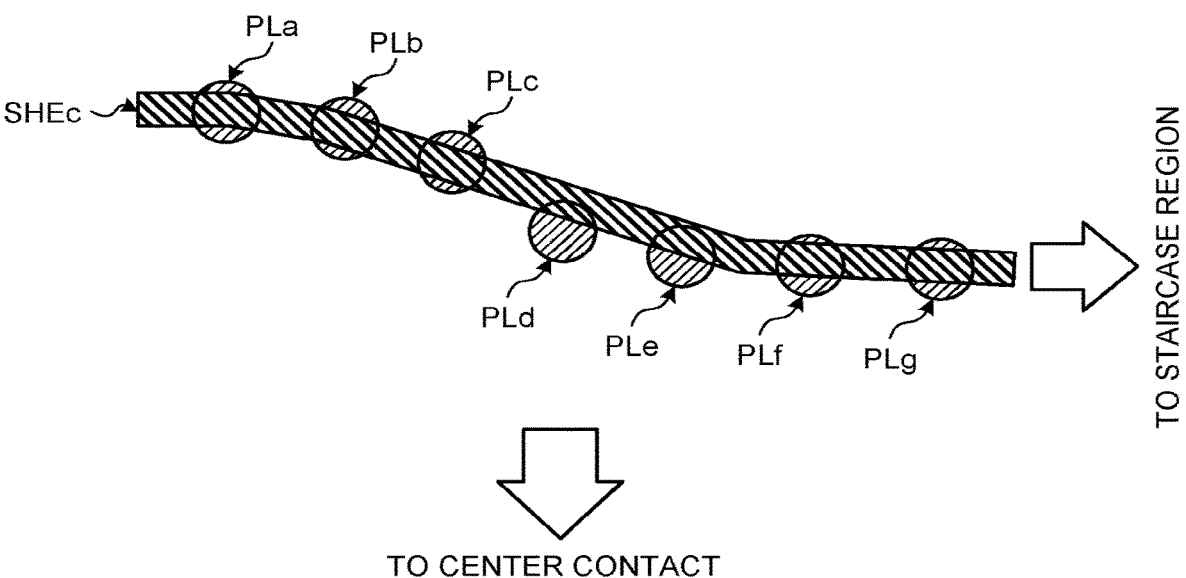
FIG. 8 is a drawing illustrating a positional relation between pillars and an isolation layer in the semiconductor memory device according to the second embodiment.

A positional relation between the isolation layer SHEc, and the pillars PL that overlap the isolation layer SHEc in the stacking direction of the stacked body LM, in case the positions are adjusted with respect to the pillars PL, is illustrated in FIG. 8. FIG. 8 is a drawing illustrating a positional relation between the pillars PL and the isolation layer SHEc in the semiconductor memory device 2 according to the second embodiment.

As illustrated in FIG. 8, the pillars PLa to PLg arranged in a direction along the X direction approach the center contact LIc located on the lower side of the drawing more largely as the position comes closer to the staircase region SR2 located on the right side of the drawing. When adjusting the arrangement of the isolation layer SHEc in accordance with the pillars PLa to PLg, the isolation layer SHEc is arranged in principle so that the center positions in the Y direction of the pillars PL are substantially aligned with the center position in the Y direction of the isolation layer SHEc, when viewed in the stacking direction of the stacked body LM.

Note that the center position in the Y direction of each pillar PL is defined by the center position in the Y direction of the top face of the pillar PL, regardless of inclination of the pillar PL.

Now, the isolation layer SHEc would be adjustable only within a limited adjustable width in the Y direction. Such limitation may arise since the isolation layer SHEc is to be aligned also with some structure other than the pillars PL. In an exemplary case where the positional deviation of the pillars PL exceeds the upper limit of the adjustable width in the Y direction of the isolation layer SHEc, such as indicated by the pillars PLd and PLe, the position in the Y direction of the isolation layer SHEc is adjusted within the range at or below the upper limit value. In this case, the center position in the Y direction of the pillar PL, and the center position in the Y direction of the isolation layer SHEc, when viewed in the stacking direction of the stacked body LM, are not always necessarily aligned.

In some cases where the pillars deviate while being affected by the stress typically in the semiconductor memory device having the stacked structure as described above, the isolation layer, having been designed to overlap the pillars, would be formed while being deviated from the pillars.

In this case, at least at a position deviated from the pillar, the isolation layer would be formed so as to penetrate not only the conductive layer to be isolated in the stacked body, but also a conductive layer therebelow. This may isolate also the conductive layer to function as the word line, and may adversely affect characteristics of the semiconductor memory device.

According to the semiconductor memory device 2 of the second embodiment, in the memory region MR2, the isolation layer SHEc has a predetermined portion that extends on one side in the Y direction of the plate-like contact LI that divides the staircase region SR2 in the Y direction, and extends along the plate-like contact LI, with the distance in the Y direction from the center contact LIC continuously varied depending on the position in the X direction. Meanwhile on the other side in the Y direction of the plate-like contact LI that divides the staircase region SR2 in the Y direction, the isolation layer SHEc has a predetermined portion that extends along the plate-like contact LI, with the position inverted in the Y direction from the isolation layer SHEc on one side of the plate-like contact LI, with respect to the plate-like contact LI.

By thus arranging the isolation layer SHEc, which is formed after the replacement for forming the stacked body LM, and unlikely to be affected by the stress during the replacement, in accordance with the pillars PL possibly affected by the stress, the isolation layer SHEc can be positioned on the pillars PL that are designed to be overlapped. Hence, the depth of the isolation layer SHEc in the stacked body LM may be made almost uniform, making it possible to obtain the semiconductor memory device 2 with desired characteristics.

According to the semiconductor memory device 2 of the second embodiment, the positions of placement in the Y direction of the plurality of pillars PL arranged along the plate-like contact LI vary stepwise depending on the distance between the plurality of pillars PL and the staircase region SR2, and the positions of placement of the isolation layers SHEc vary in accordance with the positions of placement of the plurality of pillars PL.

Hence, even if the positions of placement of the plurality of pillars PL deviate due to the stress during the replacement for forming the stacked body LM, the positions of placement of the isolation layers SHEc are aligned thereto, making it possible to properly maintain the positional relation between these structures.

First Modified Example

Next, a semiconductor memory device according to a first modified example of the second embodiment will be explained, referring to FIG. 9. The semiconductor memory device of the first modified example is different from the aforementioned second embodiment, in that also the positions of placement of the isolation layers SHEc arranged in a select gate contact region SGR2 are corrected in accordance with the deviated columnar portions HR.

Figure 9:
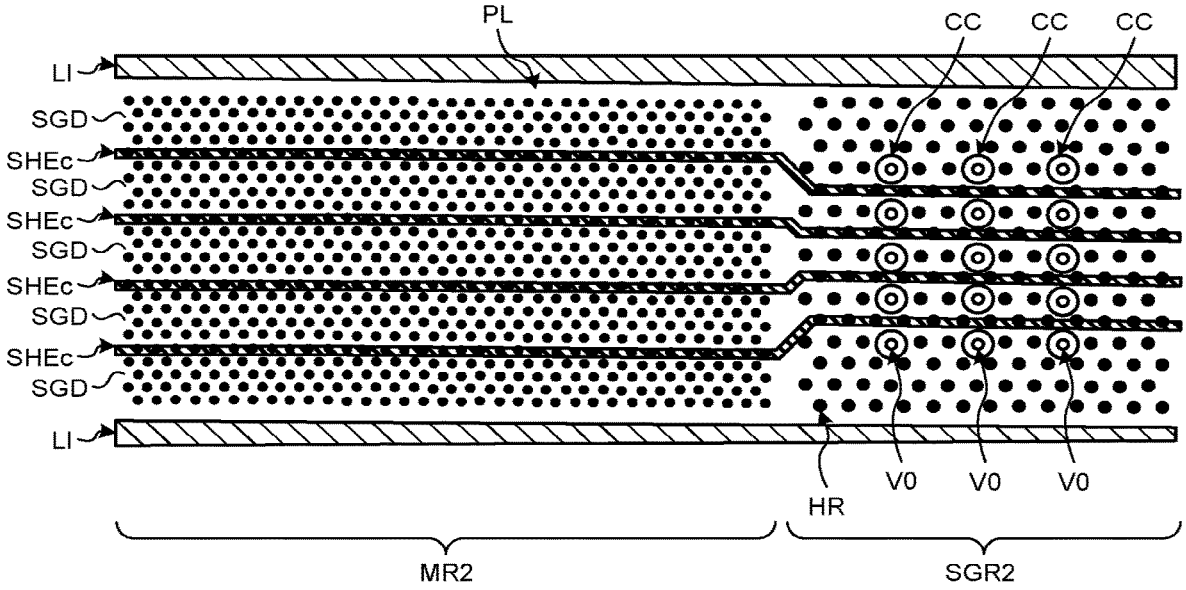
FIG. 9 is a schematic drawing illustrating an exemplary structure of a select gate contact region of a semiconductor memory device according to a first modified example of the second embodiment.

FIG. 9 is a schematic drawing illustrating an exemplary structure of the select gate contact region SGR2 of the semiconductor memory device according to the first modified example of the second embodiment. More specifically, FIG. 9 is a top view that contains a part of the memory region MR2 and the select gate contact region SGR2, neighboring the staircase region SR, with or without the through-contact region TP arranged in between.

Note, FIG. 9 does not illustrate an upper structure that contains the plugs CH and VY connected typically to the pillars PL and the plate-like contact LI, and an upper structure connected to the plugs V0 above the contacts CC. FIG. 9 illustrates a more detailed top view, similarly to FIGS. 5 and 6. Also note that, all structures in FIG. 9 same as those in the second embodiment will have same reference signs, to skip the explanation.

As illustrated in FIG. 9, also in the memory region MR2 of the semiconductor memory device of the first modified example, the positions of placement in the Y direction of the pillars PL arranged in a direction along the X direction approach the center contact LIc more largely as the position comes closer to the staircase region SR2, like in the aforementioned second embodiment. The position in the Y direction of the isolation layer SHEc is adjusted in accordance with the pillars PL.

Also in the select gate contact region SGR2 of the semiconductor memory device of the first modified example, the positions of placement in the Y direction of the columnar portions HR arranged in a direction along the X direction approach the center contact LIc more largely as the position comes closer to the staircase region SR2, like in the aforementioned first embodiment.

On the other hand, in the select gate contact region SGR2 of the semiconductor memory device of the first modified example, the isolation layer SHEc has a predetermined portion that extends along the center contact LIc, in accordance with the columnar portions HR having been affected by the stress during the replacement for forming the stacked body LM, with the distance in the Y direction from the center contact LIc continuously varied depending on the position in the X direction of the isolation layer SHEc. That is, the isolation layer SHEc approaches the center contact LIc more largely as the position comes closer to the staircase region SR2.

According to the semiconductor memory device of the first modified example, the isolation layers SHEc unlikely to be affected by the stress during the replacement for forming the stacked body LM are arranged in accordance with the columnar portions HR possibly affected by the stress, also in the select gate contact region SGR2. This successfully maintains proper positional relation among these structures.

According to the semiconductor memory device of the first modified example, any other effects same as those of the semiconductor memory device 2 of the second embodiment can be obtained.

Second Modified Example

Figure 10:
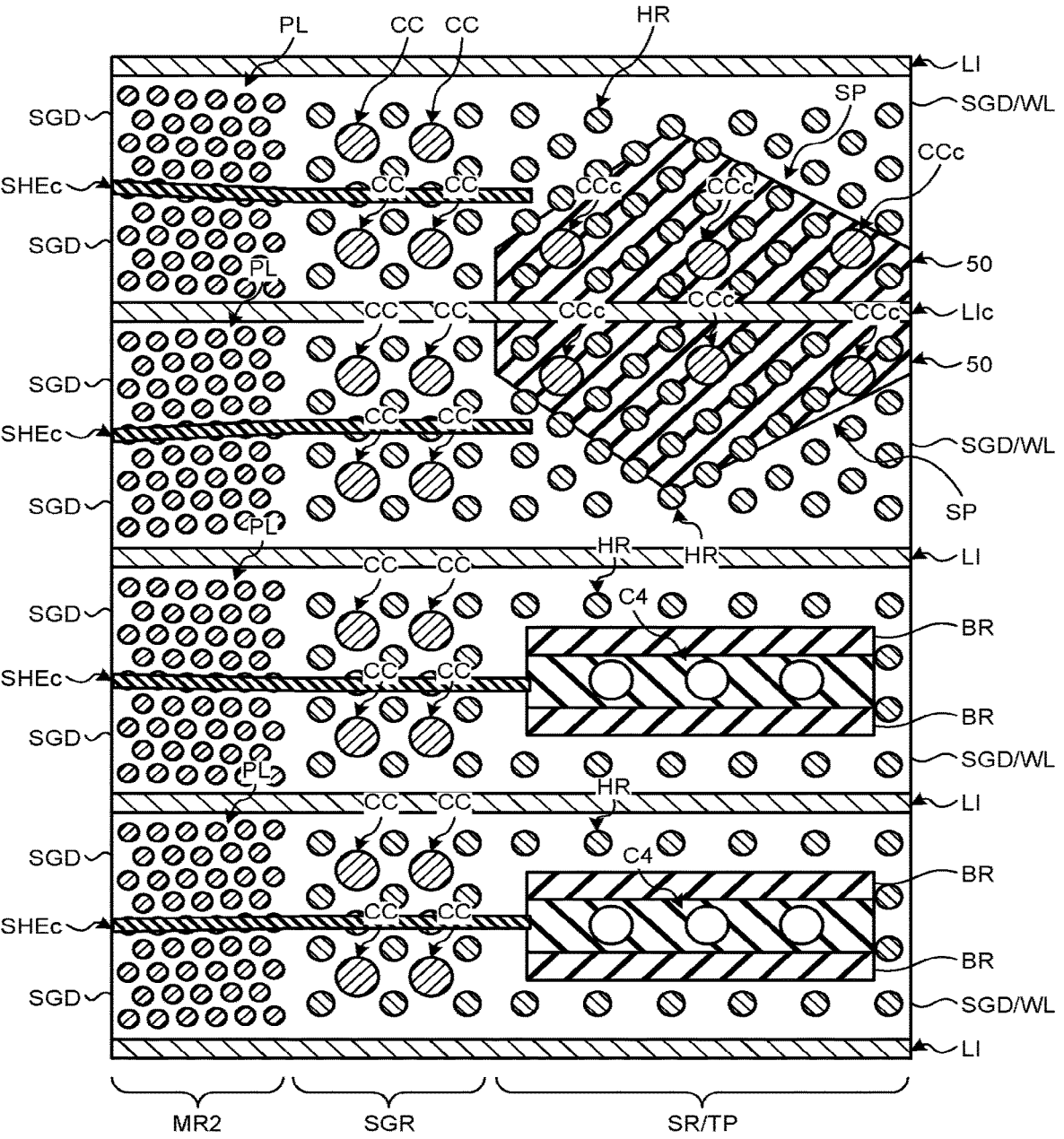
FIG. 10 is a schematic drawing illustrating an exemplary structure of a memory region and a staircase region of a semiconductor memory device according to a second modified example of the second embodiment.

There is a possible combination of the structure, like in the first embodiment, having the plurality of contacts CCc arranged in accordance with the columnar portions HR in the staircase region SR, and the structure, like in the second embodiment, having the isolation layers SHEc arranged in accordance with the pillars PL in the memory region MR2. FIG. 10 illustrates an example of such structure.

FIG. 10 is a schematic drawing illustrating an exemplary structure of the memory region MR2 and the staircase region SR of a semiconductor memory device according to a second modified example of the second embodiment. More specifically, FIG. 10 is a top view that contains a part of the memory region MR2, the select gate contact region SGR, a part of the staircase region SR, and a part of the through-contact region TP.

Note, FIG. 10 does not illustrate an upper structure that contains the plugs CH, VY and V0 connected typically to the pillars PL, the plate-like contacts LI, and the contacts CC. Also note that, all structures in FIG. 10 same as those in the second embodiment will have same reference signs, to skip the explanation.

As illustrated in FIG. 10, the semiconductor memory device 2 of the second modified example has the isolation layers SHEc whose arrangement is adjusted in the memory region MR2 in accordance with the pillars PL. In addition, the staircase region SR contains the contacts CCc whose arrangement is adjusted in accordance with the columnar portions HR, individually, or groupwise.

Note that the structure of the second modified example may contain, in the select gate contact region SGR, the contacts CCc whose arrangement is adjusted in accordance with the columnar portions HR, as in the aforementioned modified example of the first embodiment. Alternatively, the isolation layers SHEc whose arrangement is adjusted in accordance with the columnar portions HR may be contained in the select gate contact region SGR, as in the aforementioned first modified example of the second embodiment.

According to the semiconductor memory device of the second modified example, effects same as those of the semiconductor memory devices 1 and 2 of the first and second embodiments can be obtained.

Another Embodiment

Hereinafter, another embodiment will be detailed referring to the attached drawings. A semiconductor memory device according to such another embodiment is different typically from the first and second embodiments, in that the peripheral circuit is arranged above the stacked body. Note that all structures in the drawing below, same as those in the first and second embodiments, will have same reference signs to skip the explanation.
(Exemplary Structure of Semiconductor Memory Device)

Figure 11A:
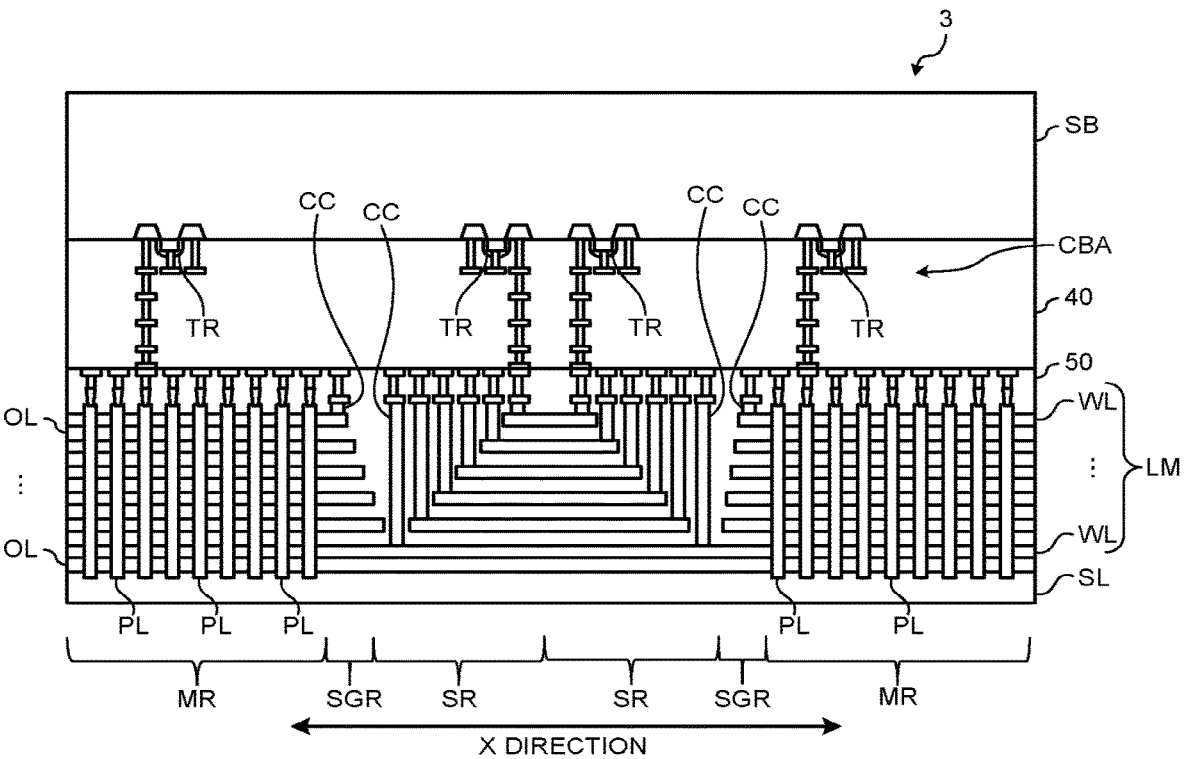
FIGS. 11A and 11B are drawings illustrating an exemplary schematic structure of a semiconductor memory device according to another embodiment.
Figure 11B:
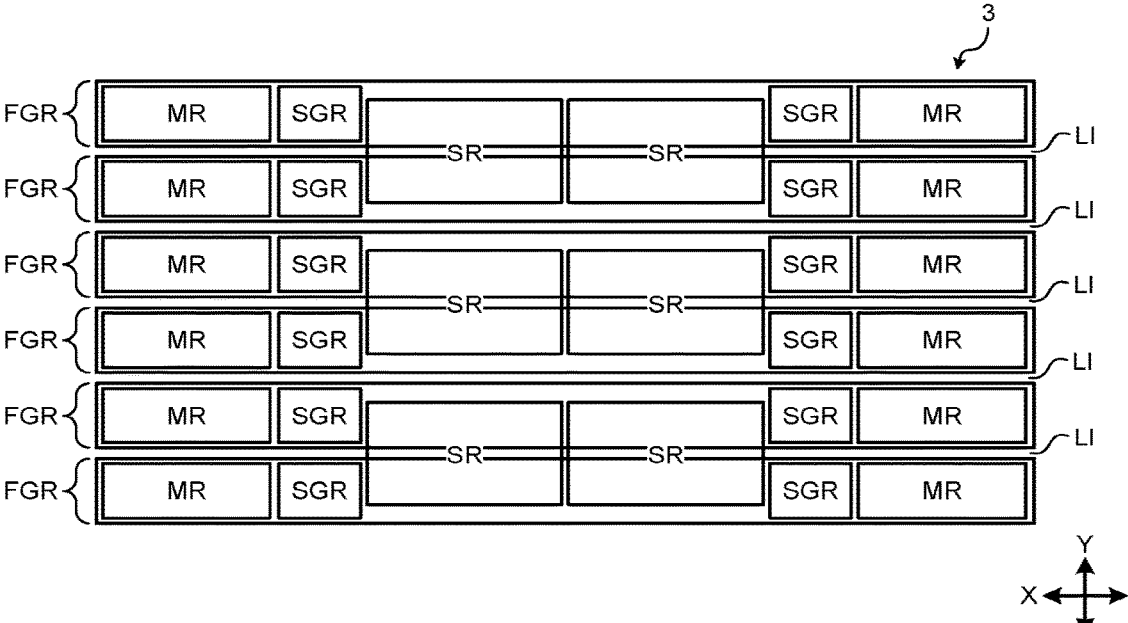

FIGS. 11A and 11B are drawings illustrating an exemplary schematic structure of a semiconductor memory device 3 according to another embodiment. FIG. 11A is a cross-sectional view of the semiconductor memory device 3 taken in the X direction, and FIG. 11B is a schematic plan view illustrating a layout of the semiconductor memory device 3. Note that FIG. 11A is presented without hatching for better visibility. FIG. 11A is also presented without a part of upper wirings.

As illustrated in FIG. 11A, the semiconductor memory device 3 has a peripheral circuit CBA arranged above the stacked body LM. More specifically, the stacked body LM is arranged above the source line SL. The stacked body LM is covered with the insulating film 50. Above the insulating film 50, the peripheral circuit CBA covered with the insulating film 40 is arranged. The substrate SB on which the peripheral circuit CBA is provided is arranged further above the peripheral circuit CBA.

As illustrated in FIG. 11B, one finger FGR has arranged therein the memory region MR, the staircase region SR, the staircase region SR, and the memory region MR, in this order from one end towards the other end in the X direction. The staircase region SR is arranged at a position that overlaps one plate-like contact LI, and is divided in the Y direction, similarly to as in the first and second embodiments. The semiconductor memory device 3 thus follows a pattern in which two fingers FGR arranged in the Y direction form a minimum unit to be repeated periodically in the Y direction.

Also in the semiconductor memory device 3 of such another embodiment, the staircase region SR may be configured similarly to the aforementioned first and second embodiments. That is, the valley-like shape of the staircase region SR of the semiconductor memory device 3 is configured to have a portion in which the depth becomes maximum at a predetermined position between one end and the other end in the X direction, and the width becomes maximum in the Y direction. In addition, the plurality of staircase portions arranged in the staircase region SR has a substantially line-symmetric structure, across the center plate-like contact LI that divides the staircase region SR in the Y direction.

Hence, also in the semiconductor memory device 3 according to such another embodiment, the pillars PL, the columnar portions HR and so forth arranged in the stacked body LM are subjected to the stress that can make them incline towards the center plate-like contact LI more largely as the position comes closer to the staircase region SR, and as the position comes closer to a portion where the staircase length in the Y direction of the staircase part in the staircase region SR becomes maximum, like in the semiconductor memory devices 1 and 2 according to the aforementioned first and second embodiments. Hence, any structure of the first embodiment or the modified example thereof, or the second embodiment or the modified examples 1 and 2 thereof is applicable also to the semiconductor memory device 3 of such another embodiment.

The semiconductor memory device 3 illustrated in FIGS. 11A and 11B is obtainable by separately forming the stacked body LM portion and the peripheral circuit CBA portion.

That is, the source line SL is formed on a support substrate such as a silicon substrate, and the stacked body LM is formed above the source line SL. Then in the stacked body LM, typically formed are the staircase portion in which the word lines WL and so forth are terraced, the pillars PL, the columnar portions HR, the plate-like contacts LI, the isolation layer SHE, and the contacts CC.

On the other hand, the peripheral circuit CBA that typically contains transistor TR and wiring is formed on the separate substrate SB, and the insulating film 40 is then formed to cover the structure. The face of the substrate SB having the peripheral circuit CBA formed thereon, and the face of the support substrate having the stacked body LM formed thereon are then bonded, and the support substrates is removed typically by chemical mechanical polishing (CMP).

The process yields the semiconductor memory device 3 in which the stacked body LM and the peripheral circuit CBA are bonded at portions of the insulating films 50 and 40. In the semiconductor memory device 3, the peripheral circuit CBA is arranged above the stacked body LM, and the structures such as the pillars PL and the contacts CC of the stacked body LM are electrically connected typically through the upper wirings to the peripheral circuit CBA. Hence, the semiconductor memory device 3 is not necessarily provided with the through-contact region TP and the through-contact C4 in the stacked body LM.

(Method for Manufacturing Semiconductor Memory Device)

Figure 12:
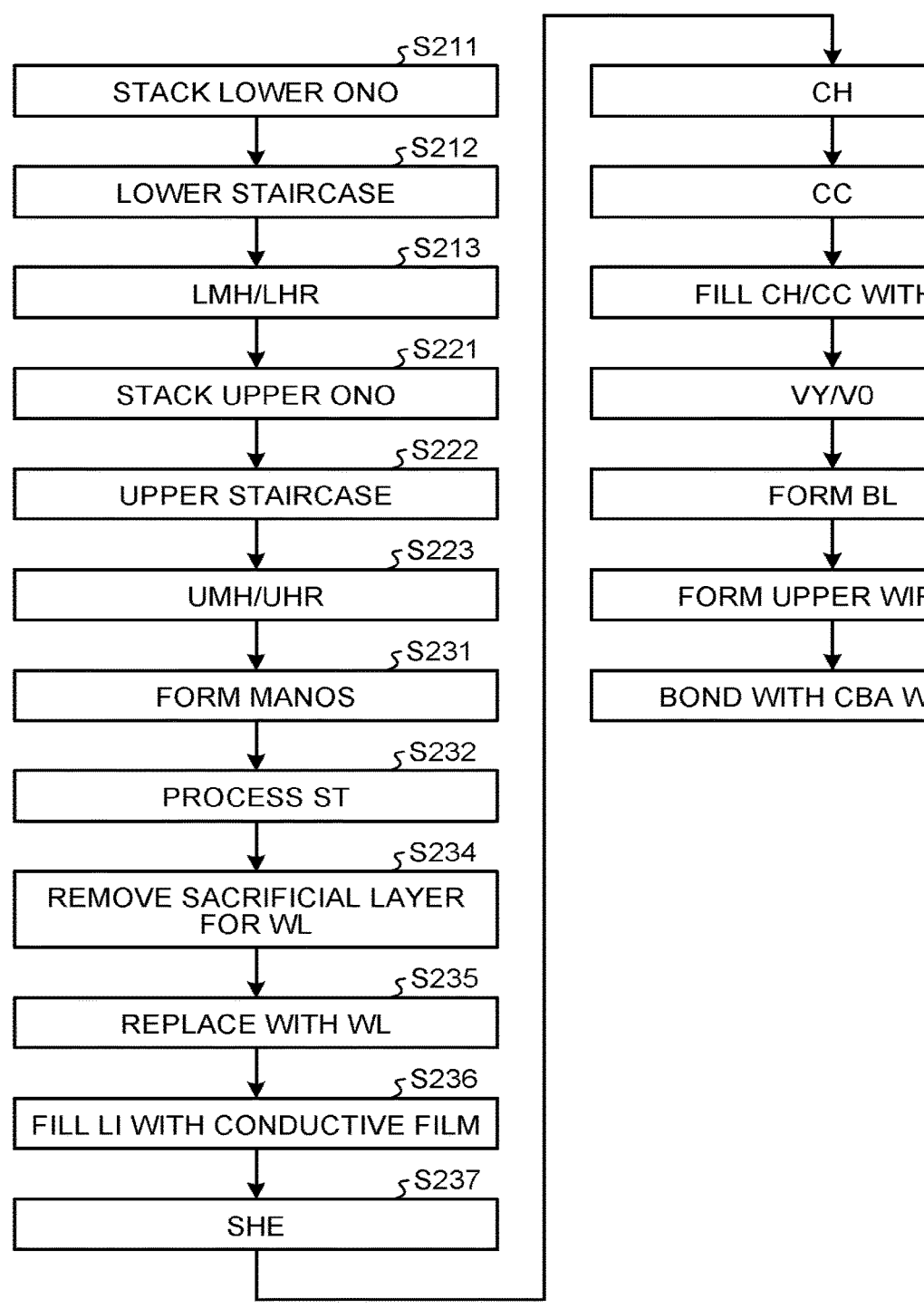
FIG. 12 is a flow chart exemplifying a part of procedures of a method for manufacturing the semiconductor memory device according to the other embodiment.

Next, a method for manufacturing the semiconductor memory device 3 according to the another embodiment will be explained, referring to FIG. 12. FIG. 12 is a flow chart exemplifying a part of procedures of a method for manufacturing the semiconductor memory device 3 according to the other embodiment.

As illustrated in FIG. 12, a plurality of sacrificial layers such as silicon nitride layers and a plurality of insulating layers OL are alternately stacked to form a lower ONO structure, above the support substrate having the source line SL formed thereon, thereby forming a first-tier stacked body (step S211).

Also a lower staircase portion is formed in the first-tier stacked body, and a recess thus produced by the staircase portion is filled with the insulating film 50 (step S212). Also the lower pillar LMH and the lower columnar portions LHR, filled with the sacrificial layer such as amorphous silicon layers, are formed in the first-tier stacked body (step S213).

Next, a plurality of sacrificial layers such as silicon nitride layers, and a plurality of insulating layers OL are alternately stacked on the first-tier stacked body to form an upper ONO structure, thereby forming a second-tier stacked body (step S221). Also an upper staircase portion is formed in the second-tier stacked body, and a recess thus produced by the staircase portion is filled with the insulating film 50 (step S222).

Also the memory holes and the holes, which later serve as the upper pillars UMH and the upper columnar portions UHR, are individually formed in the second-tier stacked body (step S223). Through these memory holes and the holes, the sacrificial layers having been filled in the lower pillar LMH and the lower columnar portion LHR are removed.

Next, the MANOS structure is formed in the lower pillars LMH and the upper pillars UMH, as well as in the lower columnar portions LHR and the upper columnar portions UHR of the select gate contact regions SGR, thereby forming the pillars PL and the columnar portions HR (step S231). On the other hand, in the staircase region SR, there are formed the columnar portions HR having the lower columnar portion LHR and the upper columnar portion UHR filled with the insulating layer.

Next, slits ST that penetrate the stacked body having the two-tire structure are formed (step S232).

Next, a removal liquid such as hot phosphoric acid is infused through the slits ST, to remove the sacrificial layer of the stacked body (step S234). A source gas such as tungsten is then introduced through the slits ST, to form the plurality of word lines WL and so forth, to a part where the sacrificial layer has been removed (step S235).

As a result of such replacement, obtainable is the stacked body LM having the two-tire structure, in which the plurality of word lines WL and the plurality of insulating layers OL are alternately stacked. During the replacement, the upper end portion of the slits ST that divide the staircase region SR in the Y direction may be compressed, so that a structure such as the pillars PL and the columnar portions HR that belong to the fingers FGR on both sides in the Y direction of the slits ST may incline towards the slits ST.

Next, a liner layer such as an insulating layer is formed in the slits ST, and a conductive layer is further filled, to form the plate-like contacts LI (step S236). Also the isolation layers SHE that extend in a direction along the X direction in the memory region MR, and reach the staircase region SR are formed (step S237). The isolation layers SHEc formed in this process may be arranged while being adjusted in accordance with the pillars PL arranged typically in the memory region MR. One or a plurality of select gate lines SGD is thus formed in the upper portion of the stacked body LM.

Next, holes used later for the plugs CH are formed in an upper layer above the stacked body LM (step S241). Also the plurality of contact holes that will serve later as the contacts CC is formed in the staircase region SR and the select gate contact region SGR (step S242). The contact holes in this process may be formed while being aligned with the columnar portions HR having been deviated typically in the staircase region SR.

Next, a liner layer such as an insulating layer is formed in these holes and contact holes, and a conductive layer is further filled. The plugs CH individually connected to the plurality of pillars PL, and the contacts CC individually connected to the plurality of word lines WL and the select gate lines SGD and SGS are thus formed (step S243). These contacts CC may include the contact CCc to which the structure of either the first embodiment or the modified example is applied.

Next, plugs VY and V0 that are connected to the plugs CH and the contacts CC, respectively, are formed in a layer further above the plugs CH (step S244).

Also the bit lines BL connected to the plugs VY are formed in a layer further above the plugs VY (step S245). Also the upper wirings connected to the plugs V0 are formed in a layer further above the plugs V0 (step S246).

Next, the substrate SB having formed thereon the peripheral circuit CBA, and the support substrate having formed thereon the stacked body LM, are bonded (step S251). Thereafter, the support substrate is removed.

The semiconductor memory device 3 according to such another embodiment is thus manufactured.

Note that the order of processes illustrated in FIG. 12 is merely illustrative, and may be suitably modified. For example, the order of the process of step S212 and the process of step S213 is interchangeable, and also the order of the process of step S222 and the processes of steps S223 and S231 is interchangeable. Also the order of the process of step S241 and the process of step S242 may be interchanged.

According to the semiconductor memory device 3 of such another embodiment, effects same as those of the semiconductor memory device 1 of the first embodiment can be obtained.

In addition, the aforementioned first embodiment and the modified example thereof, and the second embodiment and the first and second modified examples thereof, were designed to fill the slits ST, having been subjected to the replacement for forming the stacked body LM, with the conductive layer, to form the plate-like contacts LI that function as the source line contacts. Alternatively, the slits ST, having been subjected to the replacement for forming the stacked body LM, may be filled solely with an insulating layer or the like, to form a plate-like portion which does not function as the source line contact.

Also in the first embodiment and the modified example thereof, and the second embodiment and the first and second modified examples thereof, the semiconductor memory device was designed to contain the stacked body LM having the two-tier structure. The stacked body of the semiconductor memory device may alternatively have a one-tier structure, or a structure with three or more tiers. With the increased number of tiers, the number of stacking of the word lines WL may further be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:

a stacked body in which a plurality of conductive layers and a plurality of insulating layers are alternately stacked one by one, the stacked body including a memory region and a staircase region arranged in a first direction that intersects a stacking direction of the plurality of conductive layers;

a plate-like portion that extends in the stacked body in the stacking direction and in the first direction, and divides the stacked body in a second direction that intersects the stacking direction and the first direction;

a plurality of first pillars dispersedly arranged in the memory region and extending in the stacked body in the stacking direction;

a first staircase portion that is arranged in the staircase region at a position that overlaps the plate-like portion in the stacking direction, in which the plurality of conductive layers is terraced in the first direction;

a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion;

a plurality of first contacts arranged in the staircase region on one side in the second direction of the plate-like portion and along the plate-like portion, and individually connected to at least lower conductive layers among the plurality of terraced conductive layers in the first staircase portion; and a plurality of second contacts arranged in the staircase region on another side in the second direction of the plate-like portion and along the plate-like portion, and individually connected to the at least lower conductive layers in the first staircase portion, wherein the plurality of first contacts is individually arranged at different positions in the second direction relative to the plate-like portion, depending on positions in the first direction, and the plurality of second contacts is individually arranged at positions inverted in the second direction from the respective positions of the plurality of first contacts, with respect to the plate-like portion.

2. The semiconductor memory device according to claim 1, wherein positions of placement of the plurality of first contacts in the second direction vary stepwise from one end towards another end in the first direction of the first staircase portion.

3. The semiconductor memory device according to claim 2, wherein the positions of placement of the plurality of first contacts come closer to the plate-like portion as a first contact of the plurality of first contacts is connected to a conductive layer in one or more lower layers, among the conductive layers to which the plurality of first contacts is connected.

4. The semiconductor memory device according to claim 1, further comprising:

a plurality of second pillars arranged in the staircase region on the one side of the plate-like portion and along the plate-like portion, and extending in the stacked body in the stacking direction; and a plurality of third pillars arranged in the staircase region on the other side of the plate-like portion and along the plate-like portion, and extending in the stacked body in the stacking direction, wherein the plurality of second pillars is individually arranged at different positions in the second direction relative to the plate-like portion, depending on positions in the first direction, and the plurality of third pillars is individually arranged at positions inverted in the second direction from the respective positions of the plurality of second pillars, with respect to the plate-like portion.

5. The semiconductor memory device according to claim 4, wherein positions of placement of the plurality of second pillars in the second direction vary stepwise from one end towards another end in the first direction of the first staircase portion, and positions of placement of the plurality of first contacts in the second direction vary in accordance with the positions of placement of the plurality of second pillars.

6. The semiconductor memory device according to claim 1, further comprising:

a first isolation layer that penetrates, among the plurality of conductive layers, a topmost conductive layer and at least one conductive layer that is consecutive to the topmost conductive layer in the stacking direction, extends in the memory region on the one side of the plate-like portion and along the plate-like portion to reach the staircase region, to selectively isolate in the second direction two or more consecutive conductive layers that include the topmost conductive layer;

a second isolation layer that penetrates the topmost conductive layer and the at least one conductive layer, extends in the memory region on the other side of the plate-like portion and along the plate-like portion to reach the staircase region, to selectively isolate in the second direction the two or more consecutive conductive layers;

a plurality of third contacts arranged on the one side of the plate-like portion along the plate-like portion between the memory region and the staircase region, and individually connected to the two or more consecutive conductive layers; and a plurality of fourth contacts arranged on the other side of the plate-like portion along the plate-like portion between the memory region and the staircase region, and individually connected to the two or more consecutive conductive layers, wherein the plurality of third contacts is individually arranged at different positions in the second direction relative to the plate-like portion, depending on positions in the first direction, and the plurality of fourth contacts is individually arranged at positions inverted in the second direction from the respective positions of the plurality of third contacts, with respect to the plate-like portion.

7. The semiconductor memory device according to claim 6, wherein positions of placement of the plurality of third contacts in the second direction come closer to the plate-like portion as a third contact of the plurality of third contacts comes closer to the staircase region.

8. The semiconductor memory device according to claim 6, wherein the first isolation layer includes a portion that extends along the plate-like portion at a first position with a distance in the second direction from the plate-like portion continuously varied depending on positions in the first direction, and the second isolation layer includes a portion that extends along the plate-like portion at a second position that is inverted in the second direction from the first position of the first isolation layer with respect to the plate-like portion.

9. The semiconductor memory device according to claim 8, wherein the first position of the first isolation layer comes closer to the plate-like portion as the first position comes closer to the staircase region.

10. A semiconductor memory device comprising:

a stacked body in which a plurality of conductive layers and a plurality of insulating layers are alternately stacked one by one, the stacked body including a memory region and a staircase region arranged in a first direction that intersects a stacking direction of the plurality of conductive layers;

a plate-like portion that extends in the stacked body in the stacking direction and in the first direction, and divides the stacked body in a second direction that intersects the stacking direction and the first direction;

a plurality of first pillars dispersedly arranged in the memory region and extending in the stacked body in the stacking direction;

a first staircase portion that is arranged in the staircase region at a position that overlaps the plate-like portion in the stacking direction, in which the plurality of conductive layers is terraced in the first direction;

a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion; and a plurality of first contacts arranged in the staircase region on one side in the second direction of the plate-like portion and along the plate-like portion, and individually connected to at least lower layers of conductive layers among the plurality of terraced conductive layers in the first staircase portion, wherein positions of placement of the plurality of first contacts in the second direction come closer to the plate-like portion as a first contact of the plurality of first contacts is connected to a conductive layer in one or more lower layers, among the conductive layers to which the plurality of first contacts is connected.

11. A semiconductor memory device comprising:

a stacked body in which a plurality of conductive layers and a plurality of insulating layers are alternately stacked one by one, the stacked body including a memory region and a staircase region arranged in a first direction that intersects a stacking direction of the plurality of conductive layers;

a plate-like portion that extends in the stacked body in the stacking direction and in the first direction, and divides the stacked body in a second direction that intersects the stacking direction and the first direction;

a plurality of first pillars dispersedly arranged in the memory region and extending in the stacked body in the stacking direction;

a first staircase portion that is arranged in the staircase region at a position that overlaps the plate-like portion in the stacking direction, in which the plurality of conductive layers is terraced in the first direction;

a second staircase portion and a third staircase portion arranged in the staircase region on both sides in the second direction of the plate-like portion, and having structures in each of which the plurality of conductive layers is terraced, and that are mutually inverted in the second direction with respect to the plate-like portion;

a first isolation layer that penetrates, among the plurality of conductive layers, a topmost conductive layer or penetrates the topmost conductive layer and at least one more conductive layer that is consecutive to the topmost conductive layer in the stacking direction, extends in the memory region on one side in the second direction of the plate-like portion and along the plate-like portion to selectively isolate in the second direction one or more conductive layers that include the topmost conductive layer; and a second isolation layer that penetrates the topmost conductive layer or penetrates the topmost conductive layer and the at least one more conductive layer, extends in the memory region on another side in the second direction of the plate-like portion and along the plate-like portion, to selectively isolate in the second direction the one or more conductive layers, wherein the first isolation layer includes a portion that extends along the plate-like portion at a first position with a distance in the second direction from the plate-like portion continuously varied depending on positions in the first direction, and the second isolation layer includes a portion that extends along the plate-like portion at a second position that is inverted in the second direction from the first position of the first isolation layer with respect to the plate-like portion.

12. The semiconductor memory device according to claim 11, wherein the first position of the first isolation layer comes closer to the plate-like portion as the first position comes closer to the staircase region.

13. The semiconductor memory device according to claim 11, wherein the plurality of first pillars includes a first pillar row in which a part of the plurality of first pillars is arranged on the one side of the plate-like portion along the plate-like portion, and, in the first pillar row, the part of the plurality of first pillars is individually arranged at different positions in the second direction relative to the plate-like portion, depending on positions in the first direction.

14. The semiconductor memory device according to claim 13, wherein positions of placement of the part of the plurality of first pillars in the second direction vary stepwise, depending on a distance from the staircase region.

15. The semiconductor memory device according to claim 14, wherein the positions of placement of the part of the plurality of first pillars come closer to the plate-like portion as a first pillar of the part of the plurality of first pillars comes closer to the staircase region.

16. The semiconductor memory device according to claim 11, further comprising:

one or more first contacts arranged on the one side of the plate-like portion along the plate-like portion between the memory region and the staircase region, and individually connected to the one or more conductive layers; and one or more second contacts arranged on the other side of the plate-like portion along the plate-like portion between the memory region and the staircase region, and individually connected to the one or more conductive layers, wherein the first isolation layer includes a portion that extends along the plate-like portion at a third position with a distance in the second direction from the plate-like portion continuously varied depending on positions in the first direction in a region where the one or more first contacts are arranged, and the second isolation layer includes a portion that extends along the plate-like portion at a fourth position that is inverted in the second direction from the third position of the first isolation layer with respect to the plate-like portion in a region where the one or more second contacts are arranged.

17. The semiconductor memory device according to claim 16, wherein the third position of the first isolation layer comes closer to the plate-like portion as the third position comes closer to the staircase region.

18. The semiconductor memory device according to claim 16, further comprising:

a plurality of second pillars arranged in the region where the one or more first contacts are arranged, on the one side of the plate-like portion and along the plate-like portion, and extending in the stacked body in the stacking direction; and a plurality of third pillars arranged in the region where the one or more second contacts are arranged, on the other side of the plate-like portion and along the plate-like portion, and extending in the stacked body in the stacking direction, wherein the plurality of second pillars is individually arranged at different positions in the second direction relative to the plate-like portion, depending on positions in the first direction, and the plurality of third pillars is individually arranged at positions inverted in the second direction from the respective positions of the plurality of second pillars, with respect to the plate-like portion.

19. The semiconductor memory device according to claim 18, wherein positions of placement of the plurality of second pillars in the second direction vary stepwise depending on a distance from the staircase region, and the third position of the first isolation layer varies depending on the positions of placement of the plurality of second pillars.

20. The semiconductor memory device according to claim 19, wherein the positions of placement of the plurality of the second pillars come closer to the plate-like portion as a second pillar of the plurality of the second pillars comes closer to the staircase region.

\* \* \* \* \*